United States Patent [19]
Tai et al.

[11] Patent Number: 5,408,112
[45] Date of Patent: Apr. 18, 1995

[54] SEMICONDUCTOR STRAIN SENSOR HAVING IMPROVED RESISTANCE TO BONDING STRAIN EFFECTS

[75] Inventors: Akira Tai, Kasugai; Toshitaka Yamada, Nagoya; Yoshinori Fujihashi, Motosu; Tsuyoshi Fukada, Aichi; Hirohito Shioya, Chiryu; Yoshimi Yoshino, Inuyama; Hiroshige Sugito, Nagoya, all of Japan

[73] Assignee: Nippondenso Co., Ltd., Kariya, Japan

[21] Appl. No.: 91,068

[22] Filed: Jul. 14, 1993

Related U.S. Application Data

[63] Continuation-in-part of Ser. No. 892,132, Jun. 2, 1992, abandoned.

[30] Foreign Application Priority Data

Jun. 3, 1991 [JP] Japan ................................. 3-131444
Jul. 15, 1992 [JP] Japan ................................. 4-188401
Sep. 24, 1992 [JP] Japan ................................. 4-255113

[51] Int. Cl.⁶ .................................... H01L 29/84
[52] U.S. Cl. .................................... 257/254; 257/418; 257/419; 257/420; 257/417; 73/517 R; 73/720; 73/721
[58] Field of Search ............... 257/417, 418, 419, 420; 73/720, 721, 517 R

[56] References Cited

U.S. PATENT DOCUMENTS

| | | | |
|---|---|---|---|
| 4,829,822 | 5/1989 | Imai et al. | 73/516 R |
| 4,963,954 | 10/1990 | Hälg et al. | 257/418 |
| 4,967,597 | 11/1990 | Yamada et al. | 73/518 R |
| 5,000,817 | 3/1991 | Aine | 73/517 R |
| 5,068,203 | 11/1991 | Logsdon et al. | 257/417 X |
| 5,160,693 | 11/1992 | Eckert et al. | 266/235 |

FOREIGN PATENT DOCUMENTS

| | | |
|---|---|---|
| 2218172 | 8/1990 | Japan . |
| 3131766 | 6/1991 | Japan . |
| 3229470 | 10/1991 | Japan . |
| 4169856 | 6/1992 | Japan . |
| 4169857 | 6/1992 | Japan . |

OTHER PUBLICATIONS

Knutti et al., "Advanced Silicon Microstructures," ASICT Conference, 11 Apr. 1989, reprinted by IC Sensors, U.S.A., pp. 1-6.

Henry V. Allen, et al., "Accelerometer Systems with Built-in Testing," Transducers '89, Proceedings of the 5th Int'l Conf. on Solid-State Sensors and Actuators and Eurosensors III, Jun. 25-30, 1989, Monteux, Switzerland.

Stephen Terry, "A Miniature Silicon Accelerometer with Built-in Damping," Paper presented at IEEE Solid-State Sensors & Actuators Workshop on 8 Jun. 1988, Hilton Head, South Carolina.

*Primary Examiner*—William Mintel
*Attorney, Agent, or Firm*—Cushman, Darby & Cushman

[57] ABSTRACT

A semiconductor strain sensor includes a base, a peripheral section, a central section and a flexible beam. The peripheral section is bent to the base. Bonding strain is generated at a bonding portion between the base and the peripheral section. The central section extends from the peripheral section. The flexible beam extends from the central section and includes a strain detecting element. The strain detecting element changes its electric characteristic when strain is applied thereto. A thickness of the flexible beam is thinner than that of the central section. The bonding strain is transmitted from the bonding portion to the strain detecting element through a transmission path. The transmission path is bent. The bonding strain is attenuated because it is dispersed at a bending portion of the transmission path. The sensor accurately detects the strain to be detected without a bad influence of the bonding strain.

28 Claims, 27 Drawing Sheets

OXIDE FILM THICKNESS ON BEAM VS. BEAM THICKNESS

SEMICONDUCTOR STRAIN SENSOR HAVING IMPROVED RESISTANCE TO BONDING STRAIN EFFECTS

CROSS-REFERENCES TO RELATED APPLICATIONS

This application is a continuation-in-part of U.S. patent application Ser. No. 892,132, filed on Jun. 2, 1992, now abandoned.

BACKGROUND OF THE INVENTION

1. Field of the Invention

The present invention relates to a semiconductor strain sensor for detecting acceleration, strain or the like.

2. Description of the Related Art

A semiconductor acceleration sensor has been used as an automotive acceleration sensor. The sensor has a piezo-resistive element. Such a sensor is disclosed in U.S. Pat. No. 4,967,597 or Japanese patent application laid-open No. Hei2-231571. The sensor includes a cantilever and a base connecting with, and supporting the cantilever. The cantilever is composed of a silicon chip. The cantilever includes a thin flexible beam which is deformed in response to the acceleration to be measured. A piezo-resistive layer is formed in the flexible beam. The thickness of the flexible beam is generally about 40 $\mu$m.

This sensor is particularly useful in an air-bag system in order to detect the variation in acceleration within a predetermined period of time. Generally, the acceleration in the air-bag system is relatively high, and ranges between 5G and 49G.

In recent years, use of the acceleration sensor in an automotive ABS (Antiskid Brake System) has been investigated. Generally, an acceleration in the ABS is relatively low, and is less than 1.5G. The sensor for predetermined time, not the variation within the predetermined period. Therefore, the output of the sensor needs to respond in a linear manner to the acceleration. Moreover, the output characteristics of the sensor preferably are not affected by variations in ambient temperature or aging. The sensor uses at least one flexible beam to strain a piezoelectric element. The thickness of this flexible beam is less than approximately 15 $\mu$m to render the sensitivity of the sensor sufficiently high to enable the sensor to detect low acceleration of less than 1.5G.

Bonding strain is generated at a bonding portion between the cantilever and the base due to variations in ambient temperature or aging. The bonding strain in the acceleration sensor is caused by the difference of the thermal expansion coefficients of the cantilever and the base, while cooling after they are bonded to each other at a relatively high temperature. The bonding strain reaches the piezo-resistive layer. Therefore, when the sensor is highly sensitive, the output characteristic of the sensor are affected by the bonding strain, and the sensor does not detect low accelerations accurately.

Several techniques have been attempted to address the foregoing concern and to minimize the effect of the bonding strain on the sensitivity of the sensor. One technique has been to use the base which has a thermal expansion coefficient close to that of the cantilever. Another technique has been to bond the base and the cantilever by an anodic bonding method which tends to minimize the bonding strain. However, such conventional techniques have not been entirely satisfactory. Consequently, the highly-sensitive semiconductor acceleration sensor has not been practically used in the ABS, where only mechanical acceleration sensors have been used.

SUMMARY OF THE INVENTION

Accordingly, it is an object of the present invention to provide a semiconductor strain sensor which accurately detects strain caused by acceleration or like factors, without significant effects from variations in ambient temperature or aging.

Another object of the present invention is to provide a highly sensitive semiconductor strain sensor.

To accomplish the foregoing and other objects, the semiconductor strain sensor of the present invention includes a base, a peripheral section, a central section and a flexible beam. The peripheral section is bonded to the base. Bonding strain is generated at a bonding portion between the base and the peripheral section. The central section extends from the peripheral section. The flexible beam extends from the central section and includes a strain detecting element. The strain detecting element changes its electric characteristics when strain is applied thereto. A thickness of the flexible member is thinner than that of the central section. The bonding strain transmits from the bonding portion to the strain detecting element through a transmission path. The transmission path is bent.

When the bonding strain is transmitted through the transmission path, the bonding strain is attenuated because it is dispersed at a bending portion of the transmission path, and only a part of the strain transmits along the transmission path. Therefore, even if the flexible beam is thinned so as to make sensitivity high, the sensor accurately detects the strain to be detected without the undesirable influence of the bonding strain.

BRIEF DESCRIPTION OF THE DRAWINGS

The feature of the present invention that are believed to be novel are set forth with particularity in the appended claims. The invention, together with the objects and advantages thereof, may best be understood by reference to the following description of the presently preferred embodiments together with the accompanying drawings in which:

DESCRIPTION OF THE PREFERRED EMBODIMENT

Figure 1:
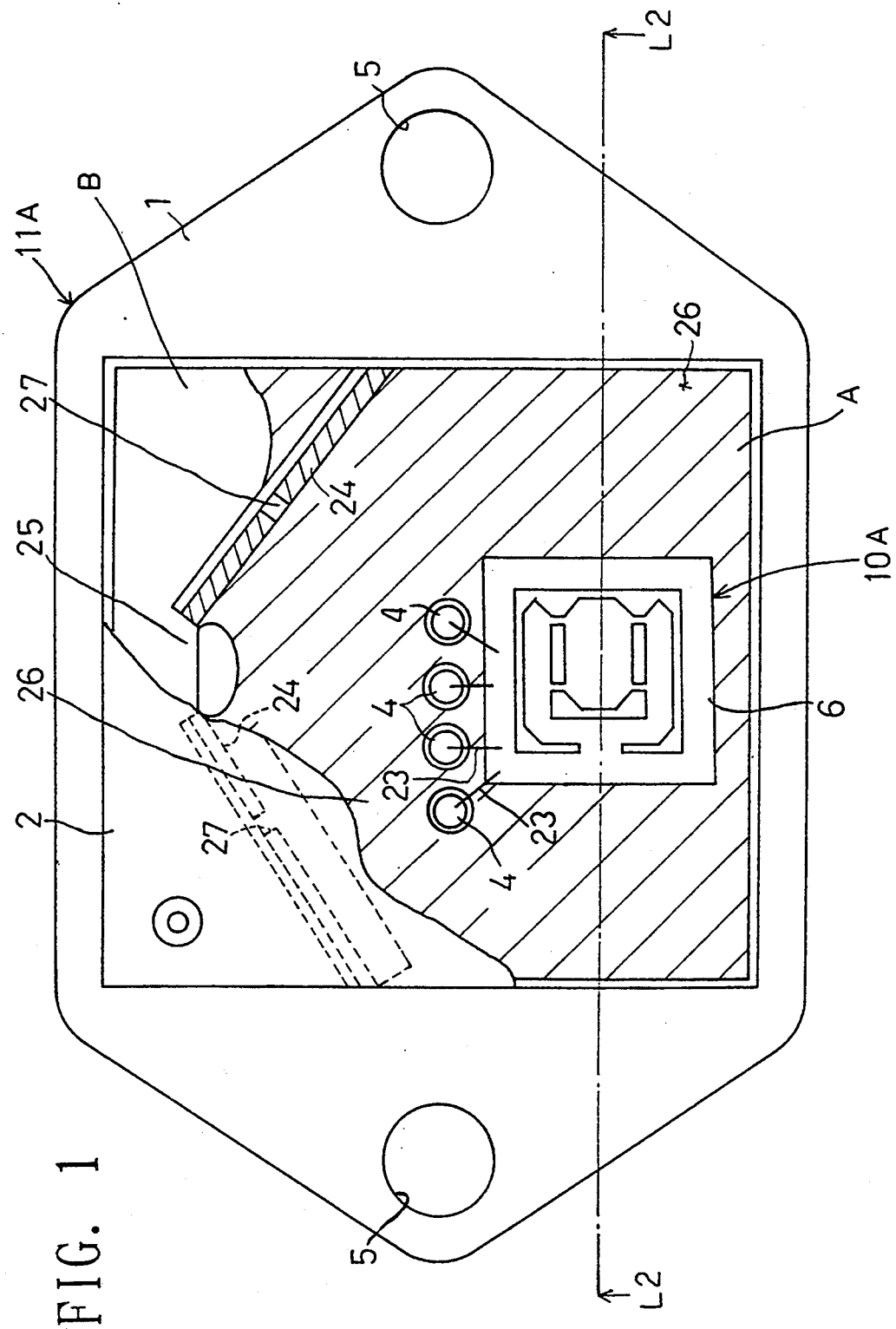
FIG. 1 is a partially cutaway view of a semiconductor acceleration sensor unit according to a first embodiment of the present invention.
Figure 2:
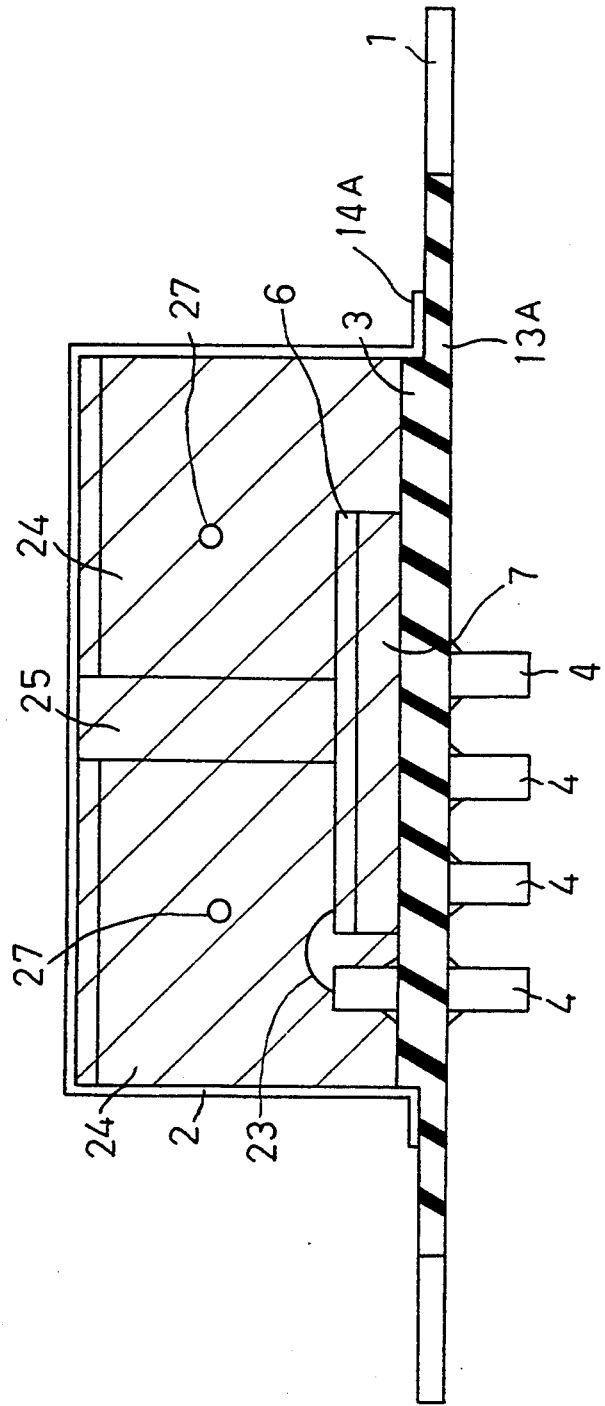
FIG. 2 is an enlarged sectional elevational view of the sensor unit taken along line L2–L2 of FIG. 1.
Figure 3:
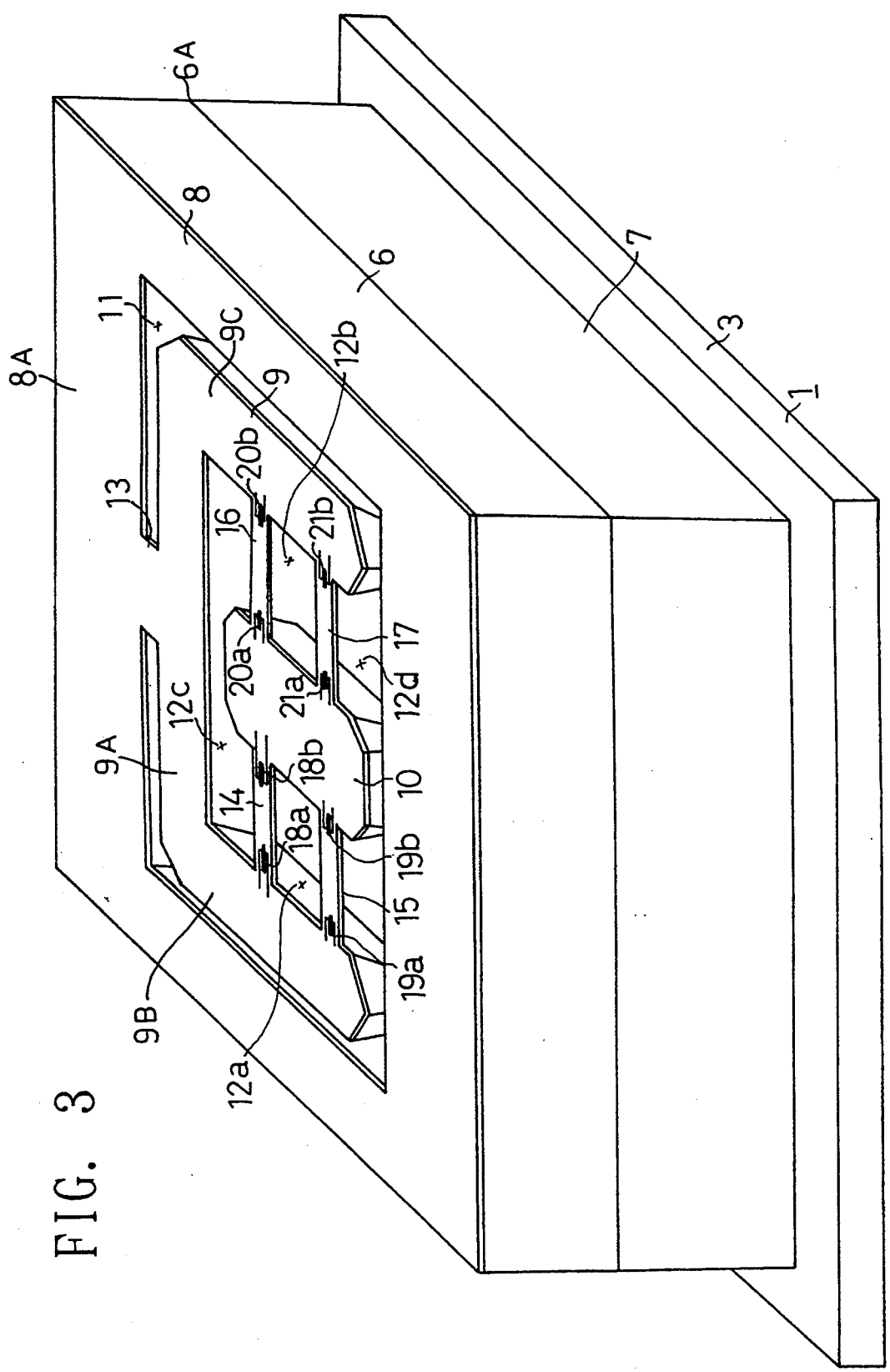
FIG. 3 is a greatly enlarged perspective view of the sensing element (sensor chip) of FIG. 1.

The preferred embodiment of the present invention will now be described with reference to the drawings. First embodiment FIGS. 1 and 2 show a semiconductor acceleration sensor chip 10A for use in a vehicle ABS. The sensor chip 10A is packaged in a package 11A.

The package 11A generally includes a lower package member or stem 1, and an upper package member or shell 2. The stem 1 is made of a metallic material such as Kovar, and the shell 2 is also made of a metallic material such as iron. The stem 1 has a welding portion 3A which is extending along its peripheral edges, and a raised portion 3 which is surrounded by the welding portion 13A. The shell 2 takes the general form of a box being open at its lower end, and having flanged edges 14A which extend around the open lower surface. The flanged edges 14A of the shell 2 and the welding portion of the stem 1 are sealed and bonded together by means of a conventional welding process.

The package 11A accommodates a sensor chip 10A which will be described below in greater detail. In order to access the sensor chip 10A, the raised portion 3 is provided with four through-holes for receiving four electrical terminals 4. The electrical terminals 4 are fixed to the stem 1 by means of a glass fusion process. The stem 1 has a pair of holes 5 for attaching the sensor package 11A to a vehicle.

FIGS. 3–6 illustrate in greater detail the elements of the sensor chip 10A. The sensor chip 10A includes a base 7 which is mounted on the raised portion 3 and a silicon chip 6 which is mounted atop the base 7. The base 7 is preferably made of Pyrex glass material, however other insulating materials could alternatively be used. Pyrex is a registered trademark of Corning Glass Works. The base 7 has a generally flat square shape. The silicon chip 6 is bonded to the upper surface of the base 7. The chip 6 basically has a generally square flat shape and a thickness of about 350 μm.

In the preferred embodiment, the chip 6 is made of silicon. It should however be understood to those skilled in the art, after reviewing the present specification, that other semiconductive material, such as gallium arsenide, could alternatively be used. The silicon chip 6 has an upper surface 8 and a lower surface (not shown). The lower surface is bonded to the base 7. The upper surface 8 has a generally square configuration and includes a peripheral section 8A and a central section 9. The peripheral section 8A and the central section 9 are generally separated by a gap 11, but are connected by means of a connecting member 13.

The central section 9 includes a generally U-shaped member, and supports a mass 10 and a plurality of flexible beams 14–17. The mass 10 is located substantially inside the central section 9, and is connected to the U-shaped member via a plurality of flexible beams 14, 15, 16 and 17. While only four beams will be described in connection with the preferred design, it should be understood that another number of flexible, beams could alternatively be selected without departing from the spirit and scope of the present invention. The mass 10 is separated from the central section 9 and the peripheral section 8A by four gaps indicated as 12a, 12b, 12c and 12d.

The central section 9 has three members which are interconnected to give it its U-shape configuration. A central member 9A is secured at its middle to the connecting member 13. Two generally similar lateral members 9B and 9C extend from, and are symmetrically disposed with respect to the central member 9A. The flexible beams 14, 15, 16 and 17 extend inwardly from the lateral members 9B and 9C, for interconnecting the lateral members to the mass 10. While the preferred embodiment shows two flexible beams extending from each lateral member, it should be understood that other configurations are anticipated by the present invention.

The thicknesses of the central section 9, the mass 10 and the connecting member 13 are generally similar to that of the peripheral section 8A. The thicknesses of the flexible beams 14, 15, 16 and 17 are generally smaller than that of the peripheral section 8A, and each is approximately 5 μm.

Piezo-resistive layers 18a and 18b, 19a and 19b, 20a and 20b, and 21a and 21b are formed on the flexible beams 14, 15, 16 and 17 respectively by pairs.

A groove 22 is formed in the base 7 to allow the mass 10 to be displaced vertically therewithin, in relation to the acceleration being measured. The depth of the groove 22 is designed so that the mass 10 does not contact the base 7 when normal acceleration is applied to the sensor chip 10A.

Figure 6:
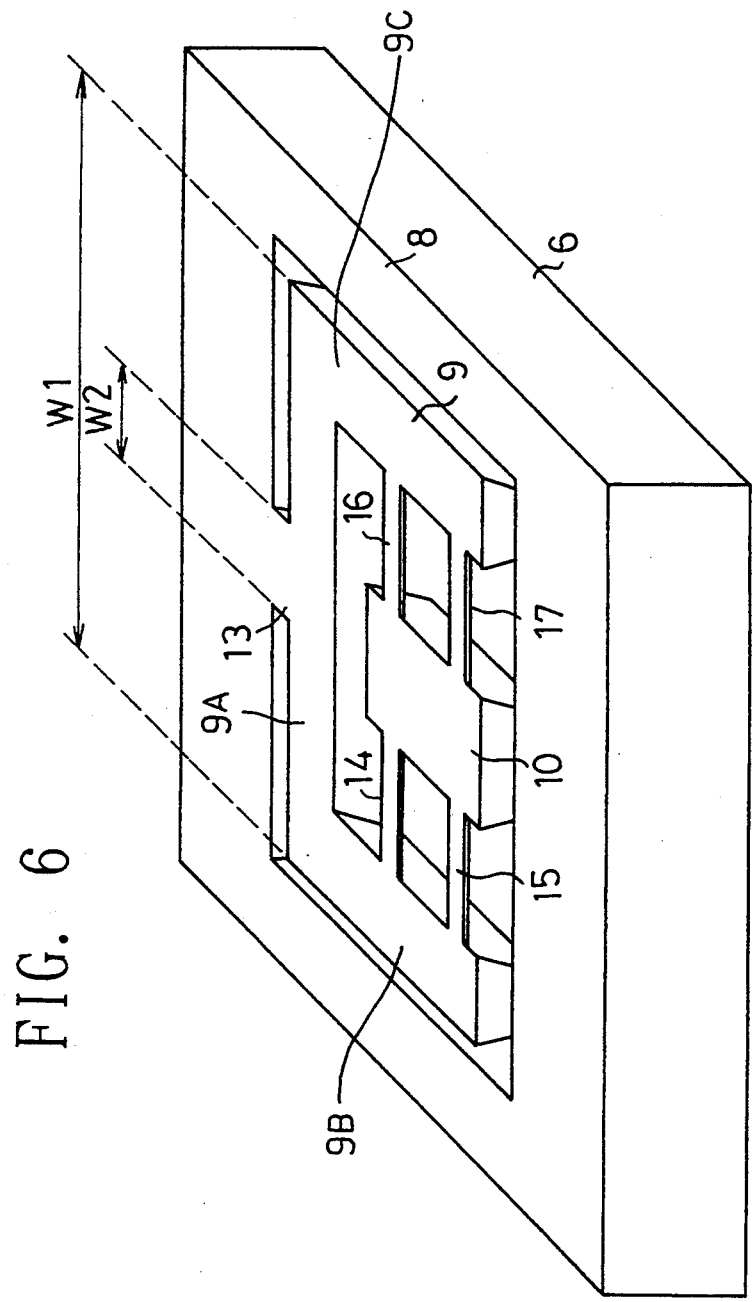
FIG. 6 is a greatly enlarged perspective view of the silicon chip of FIG. 1.

As illustrated in FIG. 6, a ratio (W2/W1) of a width W1 of the central section 9 and a width W2 of a connecting member 13 is equal to or less than 0.5.

Figure 7:
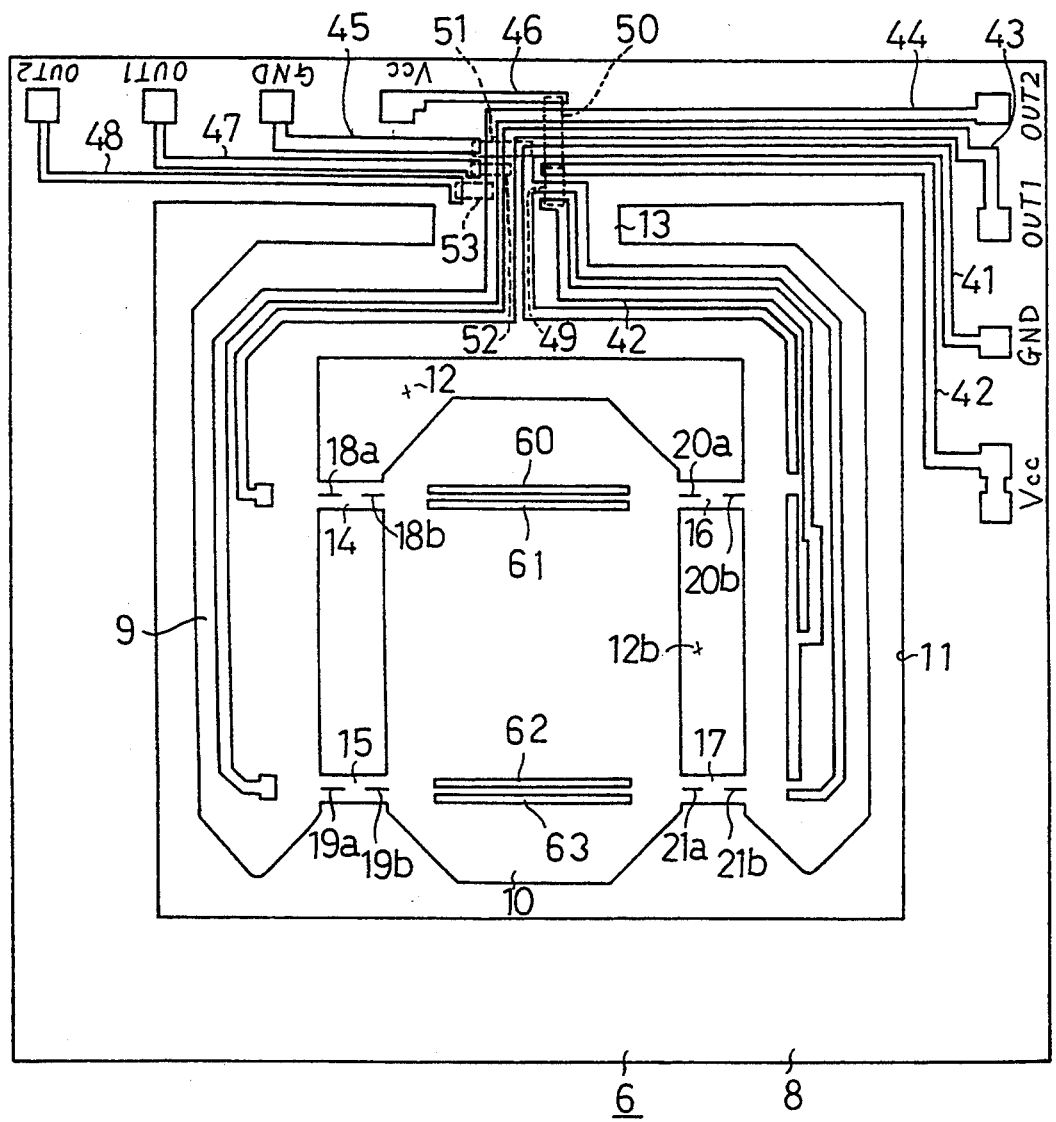
FIG. 7 is an enlarged top plan view of the sensor chip showing a plurality of wiring patterns.

Turning now to FIG. 7, there is a wiring pattern of lines which are formed on the silicon chip 6. These lines are preferably made of aluminum; however, other similar materials could also be used, such as Al—Si, Al—Si—Cu or the like. A first set of lines 41, 42, 43 and 44 are placed along one side of the peripheral section 8A. Line 41 is used for grounding a Wheatstone bridge circuit described below. Line 42 is used for connecting a power supply to the circuit, and lines 43 and 44 are used for outputting a potential difference as a function or corresponding to the applied acceleration.

A second set of four lines 45, 46, 47 and 48 are placed along another side of the peripheral section 8A. Line 45 is used for grounding the Wheatstone bridge circuit; line 46 is used for connecting to the power supply; and lines 47 and 48 are used for outputting a potential difference as a function of the acceleration. The selection of the lines depends on the direction of installation of the chip 6 on the base 7. The sensor chip 10A of the present embodiment uses the first set of aluminum lines 41, 42, 43 and 44.

These aluminum lines are connected to aluminum bonding pads Vcc, GND, OUT1 and OUT2. The aluminum lines 60 to 63 are also arranged on the mass 10 of the silicon chip 6.

Figure 8:
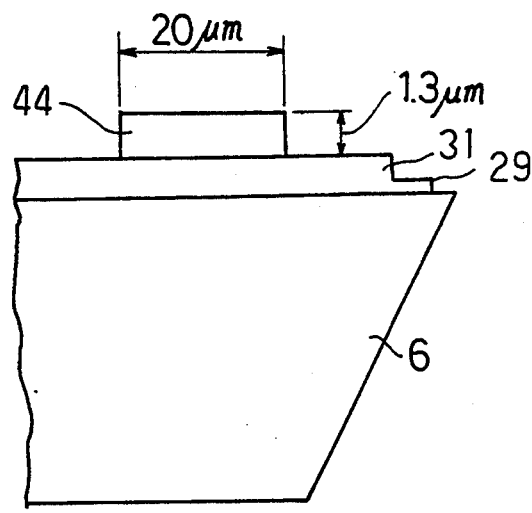
FIG. 8 is a partial cross-sectional view of the sensor chip showing an aluminum wiring electrode.

The aluminum lines 41 to 48 and 60 to 63 have the same dimensions (the same size is given for the widths and the thicknesses). That is, as shown in FIG. 8, the respective aluminum lines (the line 44 in FIG. 8) are composed of a thin film, a thickness and a width of which are 1.3 μm and 20 μm respectively, and a cross section of the line is 26 μm².

An impurity diffusion layer 49 is diffused in the chip 6 at about the middle of line 42. The line 41 crosses the impurity diffusion layer 49 and is separated therefrom by a silicon oxide film. The line 46 is electrically connected to the line 42 through an impurity diffusion layer 50. The line 45 is electrically connected to the line 41 through an impurity diffusion layer 51. The line 47 is electrically connected to the line 43 through an impurity diffusion layer 52. The impurity diffusion layers 50, 51 and 52 are diffused in the chip 6. The line 48 is electrically connected to the line 44 through an impurity diffusion layer 53. The impurity diffusion layer 53 is diffused in the chip 6 and is used for adjusting a resistance.

Figure 9:
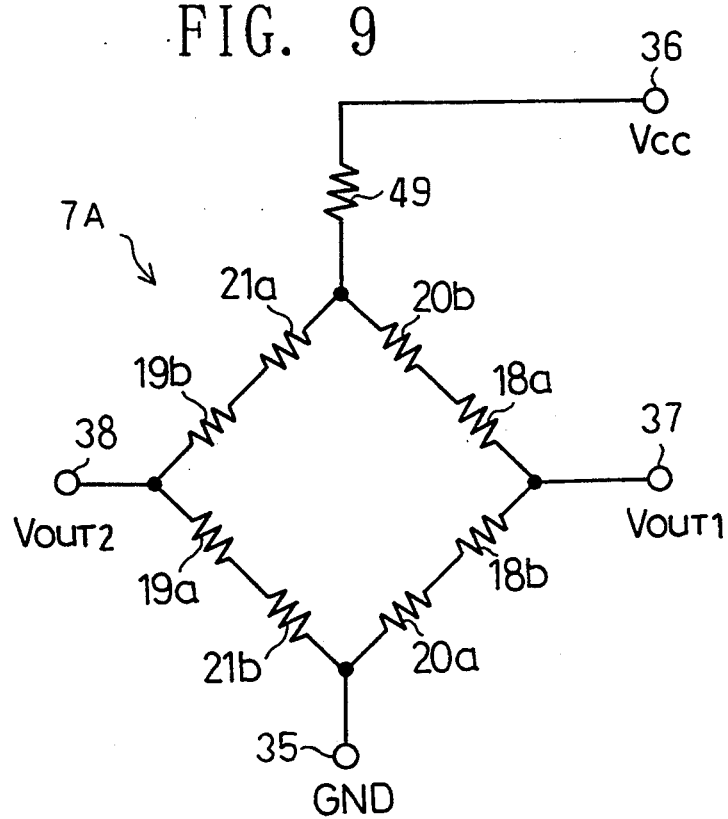
FIG. 9 is an electric circuit diagram of the sensor according to first embodiment.

The foregoing lines and the piezo-resistive layers 18a, 18b, 19a, 19b, 20a, 20b, 21a and 21b are electrically interconnected so that the Wheatstone bridge circuit 7A is formed as shown in FIG. 9. The Wheatstone bridge circuit 7A has four terminals 35, 36, 37 and 38, of which terminal 35 is grounded, and terminal 36 is connected to the power supply. The potential difference between the output terminals 37 and 38 generally varies as a function of the acceleration being measured. These four terminals 35, 36, 37 and 38 are connected to the electrical terminals 4 via wires 23, as shown in FIGS. 1 and 2.

FIGS. 1 and 2 also show two partition walls 24 which extend within recesses in the shell 2. The partition walls 24 are fixed to the shell 2 by a suitable bonding process, such as spot welding. Each of the partition walls 24 has a communication hole 27 connecting chambers A and B. The partition walls 24 are spaced apart to define a communication opening 25 for connecting two partitional lower and upper chambers A and B respectively.

The communication opening 25 extends at the top of the partition walls 24. The positions of the communication holes 27 are lower than the position of the communication opening 25. The package 11A of the sensor chip 10A contains gas and damping liquid 26, such as silicone oil. The communication holes 27 are designed to allow the damping liquid 26 to flow from the upper chamber B to the lower chamber A under the force of gravity. The partition wall is known in the art, and is described in detail in U.S. Pat. No. 4,967,597, which is incorporated herein by reference.

The process of manufacturing the above-mentioned sensor element will now be described with reference to FIGS. 10–14. It should be noted that for purposes of simplicity, only one piezo-resistive layer is drawn in each of the flexible beams in FIG. 14. Moreover, although a plurality of the sensor elements are practically formed on a single wafer, FIGS. 10–14 show only one sensor element 10A.

Figure 10:
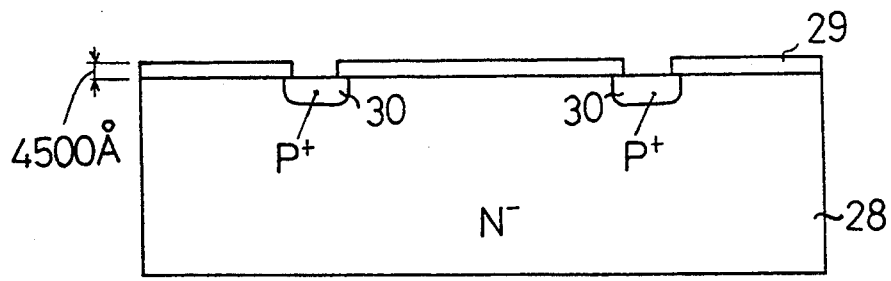
FIGS. 10–14 are cross-sectional elevational views of the sensing elements of the sensor of FIGS. 1–8, illustrating the successive steps in the manufacturing process.

An N+type silicon wafer 28 is first prepared as shown in FIG. 10. This wafer 28 corresponds to the silicon chip 6 shown in FIGS. 3–7. A first silicon oxide film 29 is formed on the entire surface of a first or upper surface of the wafer 28. The silicon oxide film 29 has a thickness of about 4500A. Predetermined regions of the silicon oxide film 29 are removed by a photo-etching process so that P+ diffusion layers 30 are formed in predetermined regions of the wafer 28.

Figure 11:
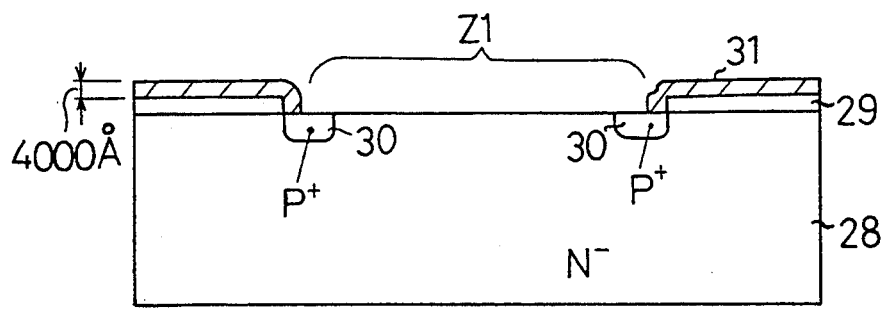

A second silicon oxide film 31 is then formed on the whole surface of the first surface by a CVD (Chemical Vapor Deposition) process. The silicon oxide film 31 has a thickness of about 4000Å. Predetermined regions Z1 of the silicon oxide films 29 and 311 are then removed by the photo-etching method as shown in FIG. 11.

Figure 12:
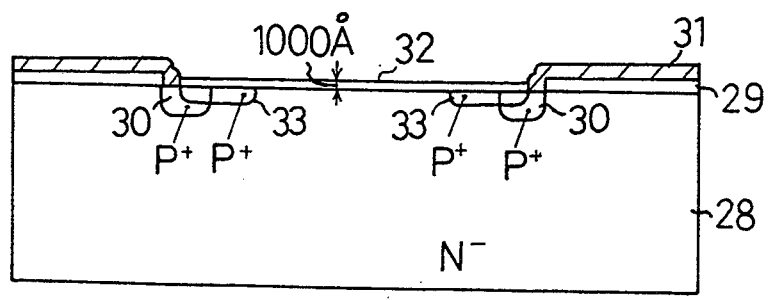

A silicon oxide film 32 is then formed on an exposed portion of the upper surface of the wafer 28, as shown in FIG. 12. The silicon oxide film 32 has a thickness of about 1000A. A mask having a predetermined pattern is placed on the silicon oxide film 32, and P+ diffusion layers 33 formed in the wafer 28 by ion implantation. These layers are piezo-resistive layers, and connect with the P+ diffusion layers 30. For the silicon oxide film 32, a diffusion of phosphorus (thermal diffusion at an extent of 900° C. to 1000° C.) is performed to transform the surface into a PSG for gettering.

Figure 13:
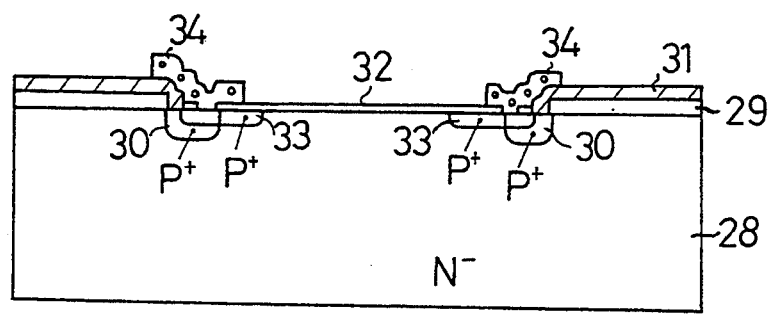

Contact holes are then opened in the silicon oxide films 32 on the P+ diffusion layers 30 as shown in FIG. 13. Aluminum lines 34 are formed in the contact holes and on the silicon oxide films 31 and 32. The aluminum lines 34 contact the P+ diffusion layers 30.

Figure 14:
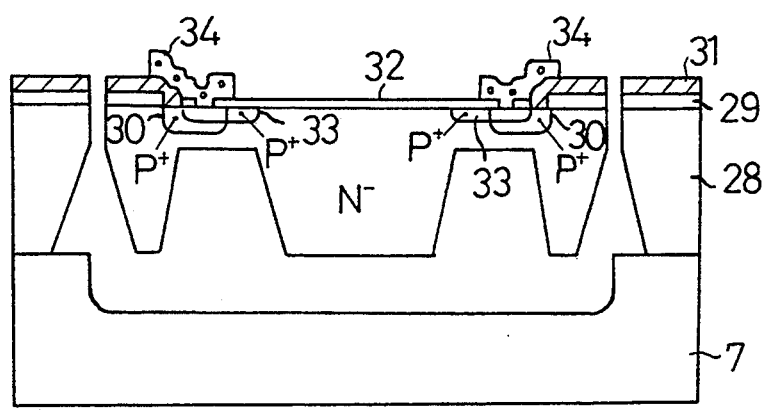

Predetermined regions of the wafer 28 are etched away from a second or bottom surface which faces the first surface so that the thickness of the predetermined regions of the wafer 28 is approximately 5 μm, as shown in FIG. 14. It is noted that this thickness is designed in accordance with the desired sensitivity of the sensing element 10A. Predetermined regions of the wafer 28 are then etched away from the first surface by more than 5 μm. The regions etched away from the first surface correspond to some of the regions etched away from the second surface for forming gaps 11, 12a, 12b, 12c and 12d.

Figure 15:
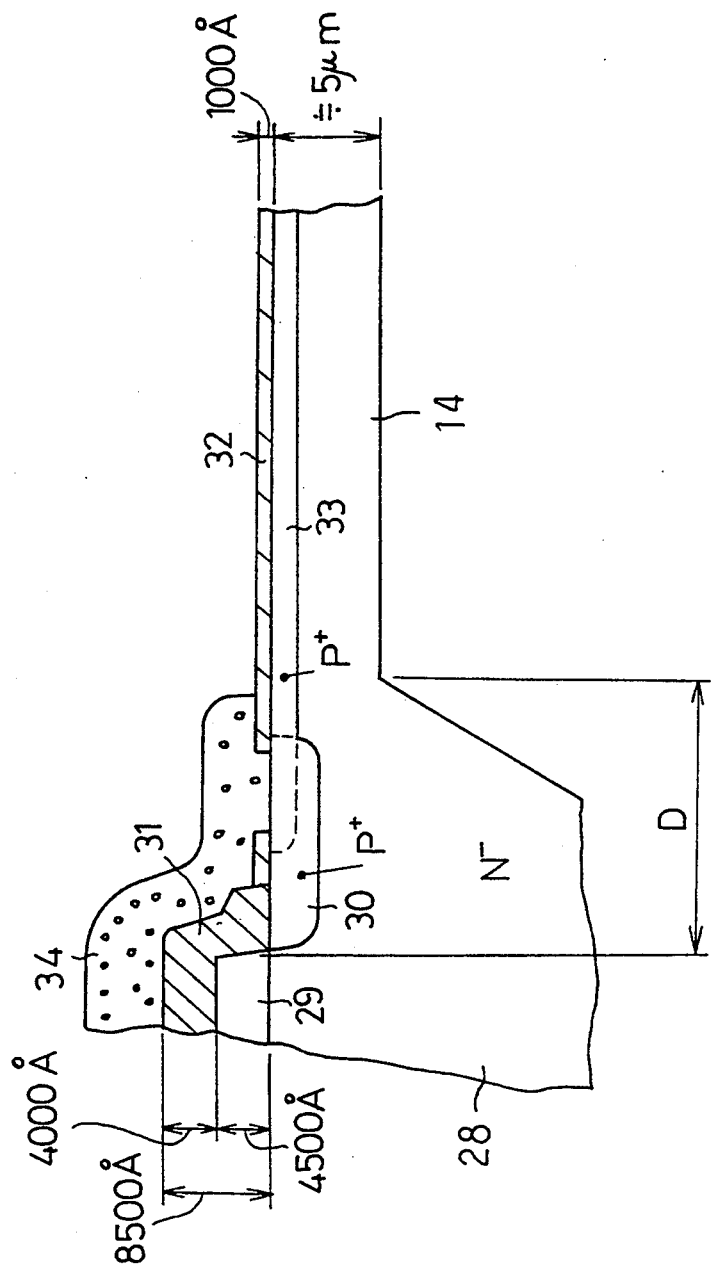
FIG. 15 is a greatly enlarged partial cross-sectional; view of a chip which forms a part of the sensor of FIGS. 1–8.

FIG. 15 is a greatly enlarged view of the wafer 28 and the silicon oxide films 29, 31 and 32 at this stage of the manufacturing process. As shown in FIG. 15 the thickness of the silicon oxide film 32 formed on the flexible beams 14–17 is about 1000Å. On the other hand, the thicknesses of the silicon oxide films 29 and 31 formed on thicker portions of the wafer 28 which have a thicker thickness than the thicknesses of the flexible beams 14–17 are about 4500Å and 4000Å respectively. The silicon oxide film 32 extends from the flexible beams 14–17 to the thicker portions by a length D, as shown in FIG. 15.

The wafer 28 is then anodic-bonded to the base 7. The wafer 28 and the base 7 are diced into the sensor chip 10A shown in FIG. 3. The base 7 is bonded on the raised portion 3. The shell 2 is bonded to the stem 1, and the package 11A is filled with the damping liquid 26.

After the assembly of the sensor package 11A is completed, the sensor package 11A is attached to a vehicle, and is placed in a predetermined directional relationship with the vehicle, so that the chambers A and B are essentially filled with the damping liquid 26 and gas.

When acceleration is applied to the sensor chip 10A, the mass 10 is displaced under its inertia force such that the strain or distortion of the flexible beams 14–17 occurs as a function of the displacement of the mass 10. Consequently, a bridge output based on the change of piezo-resistance value of the piezo-resistive layers 18a, 18b, 19a, 19b, 20a, 20b, 21a and 21b is obtained at the output terminals 37 and 38 of the bridge circuit 7A.

The output terminals 37 and 38 are connected to a controller (not shown) for the ABS. The controller detects the acceleration of the vehicle as a function of the voltage between the output terminals 37 and 38. It also calculates the deceleration of the vehicle in order to detect the friction between the tires of the vehicle and the road surface. The controller then calculates a suitable reference velocity based on that friction, and controls the slippage rate of the tires so that an actual velocity is about equal to the reference velocity.

Figure 4:
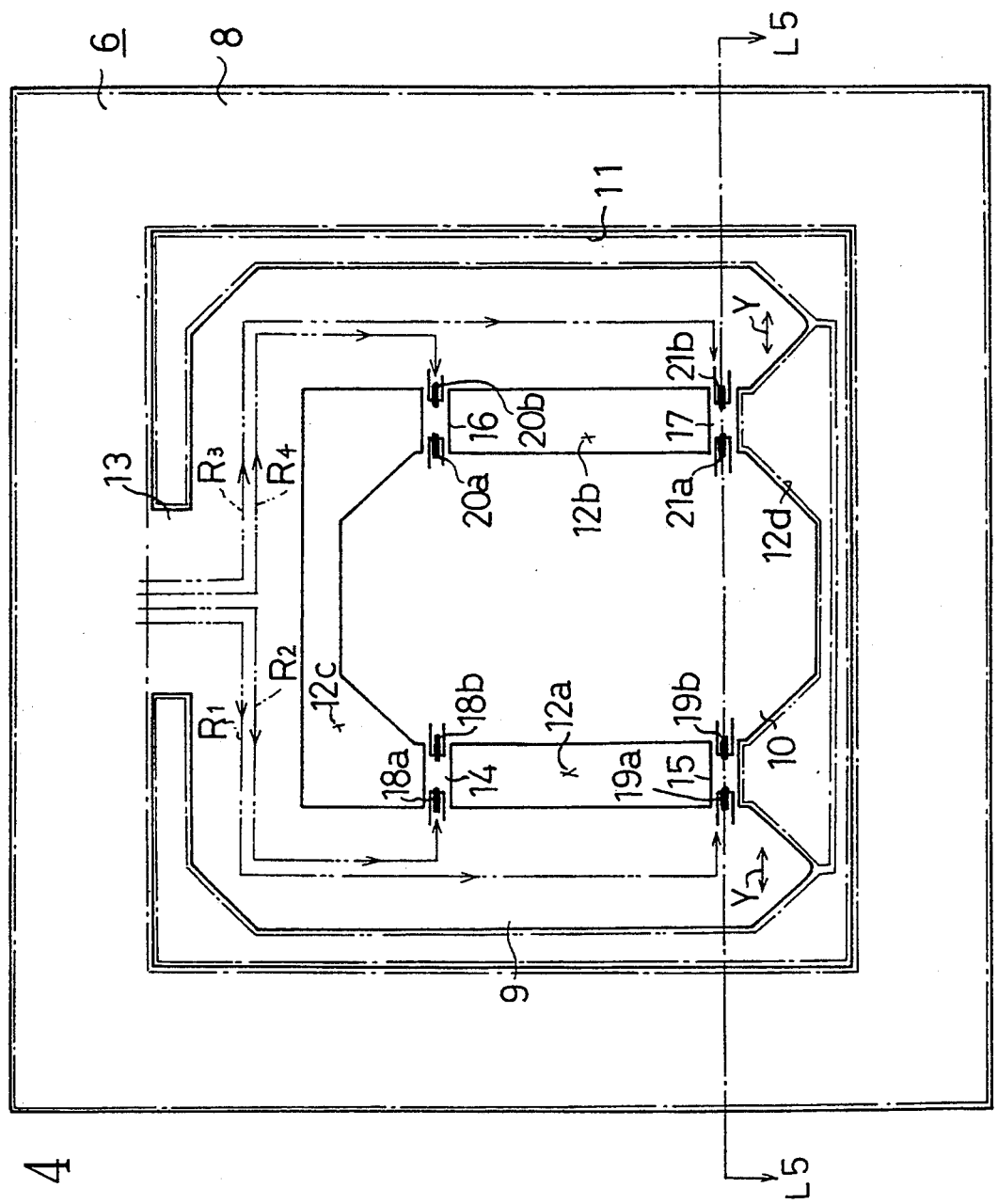
FIG. 4 is a greatly enlarged top plan view of the sensor chip of FIGS. 1–3.

Bonding strain which is generated on a bonding portion 6A between the peripheral section 8A and the base 7 may reach the flexible beams 14–17 through transmission paths R2, R1, R4 and R3, as illustrated in FIG. 4. As used in this specification, the transmission path is defined as the line extending along the central section 9, and a flexible beam. The transmission paths R1–R4 extend along the connecting member 13, the central section 9 and the flexible beams 14–17.

According to the sensor chip 10A of the present embodiment, the transmission paths R1–R4 are bent three times, and each bend is roughly a right angle. For example, the transmission path R1 is first bent between supporting member 13 and the central member 9A of the central section 9. The path R1 is then bent between the central member 9A and the lateral member 9B of the central section 9. The path R1 is further bent between the lateral member 9B and the flexible beam 15.

When the bonding strain is transmitted through the transmission paths R1–R4, it is attenuated because it is dispersed at the bending portions of the transmission paths R1–R4, and only a part of the strain transmits along the transmission paths R1–R4.

Moreover, a long transmission path can be formed in a relatively small area by bending the transmission path.

When the gap 11 is not provided, the bonding strain can be transmitted to the flexible beam closer to the corresponding peripheral section 8A. However, according to the present invention, the bonding strain is transmitted to the flexible beams 14–17 along a selected path, other than the closer side of the peripheral section 8A, since the gap 11 separates these flexible beams from the peripheral section 8A, and provides for a path via the connecting member 13. As a result, the transmission paths R1–R4 are lengthened, and bonding strain on the flexible beams 14–17 is further attenuated. Consequently, it is now possible to reduce the thickness of the flexible beams 14–17, to improve their sensitivity, and to significantly reduce, if not totally eliminate, the effect of the bonding strain on these flexible beams.

Figure 16:
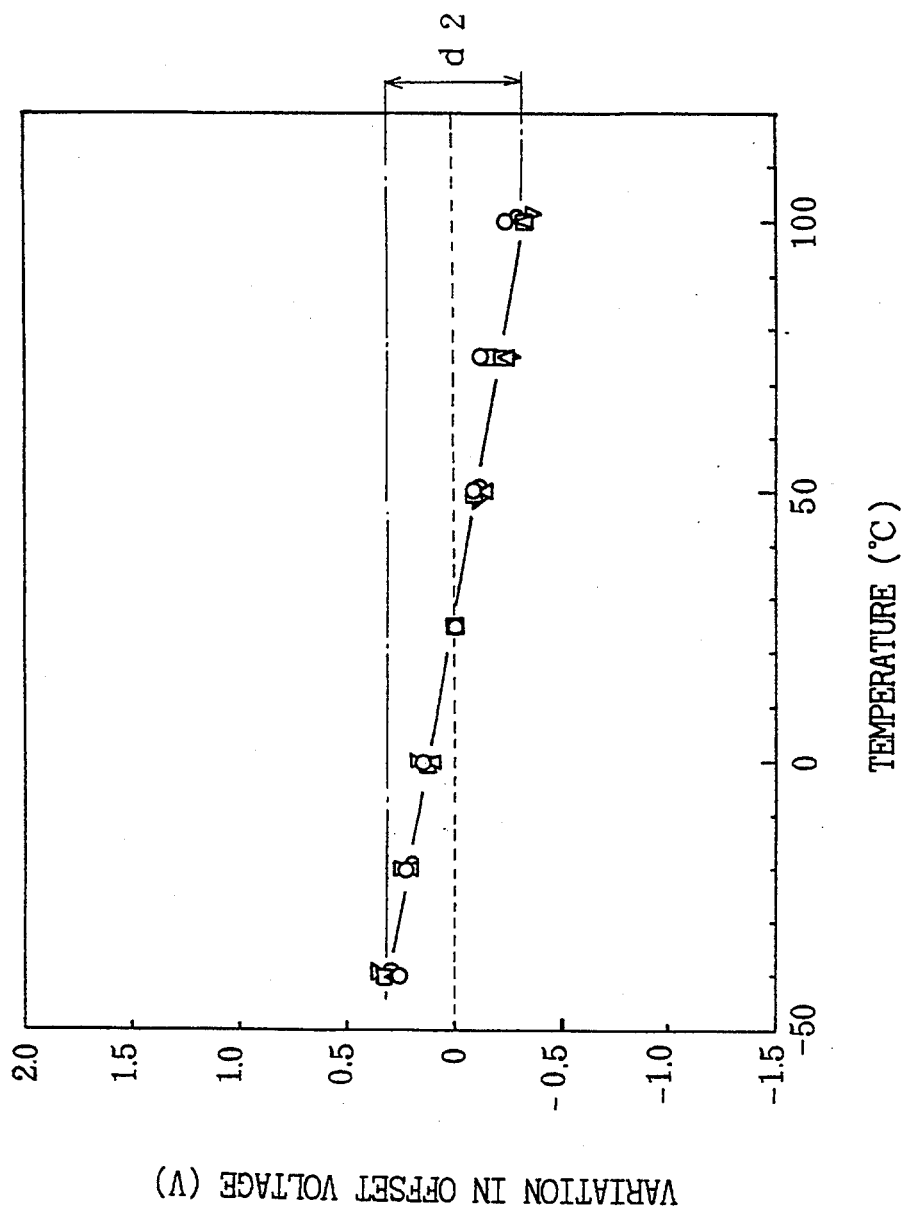
FIGS. 16 and 17 are graphs showing the relationship between temperature and variation in offset voltage.
Figure 17:
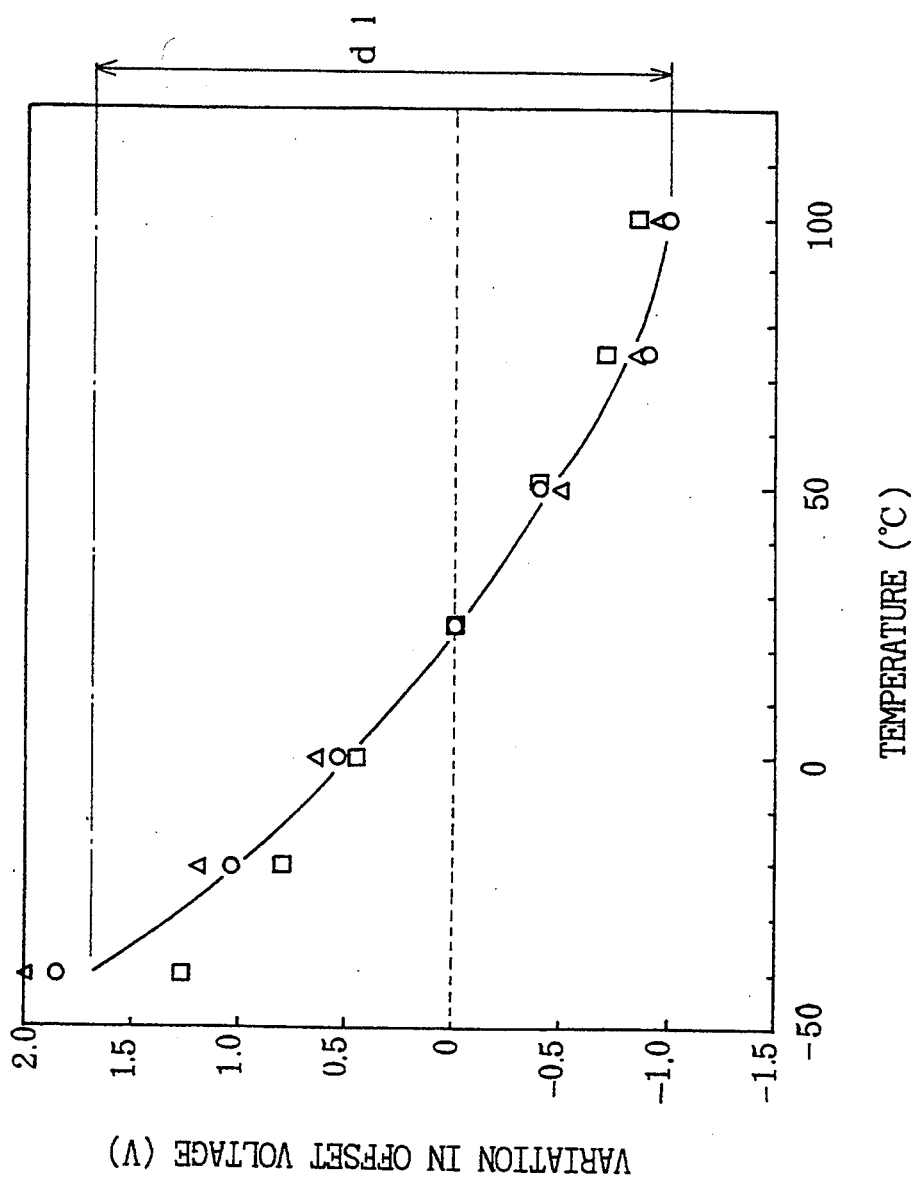

FIGS. 16 and 17 show the result of experiments on the influence of the bonding strain on the flexible beams 14–17. The abscissas of FIGS. 16 and 17 denote an ambient temperature in degrees Celsius, and the ordinates denote corresponding changes of an offset voltage, in volts. The offset voltage is the voltage between the output terminals 37 and 38 when the acceleration is not applied to the sensor chip 10A. FIG. 16 shows the result of the sensor chip 10A of the present embodiment, and FIG. 17 shows the result of a sensor which is almost identical as the sensor chip 10A of the present embodiment, but which does not include the gap 11. As shown in FIGS. 16 and 17, the change d2 in the offset voltage of the sensor chip 10A of the present embodiment is approximately one-fourth the change d1 of the sensor without the gap 11.

Figure 19:
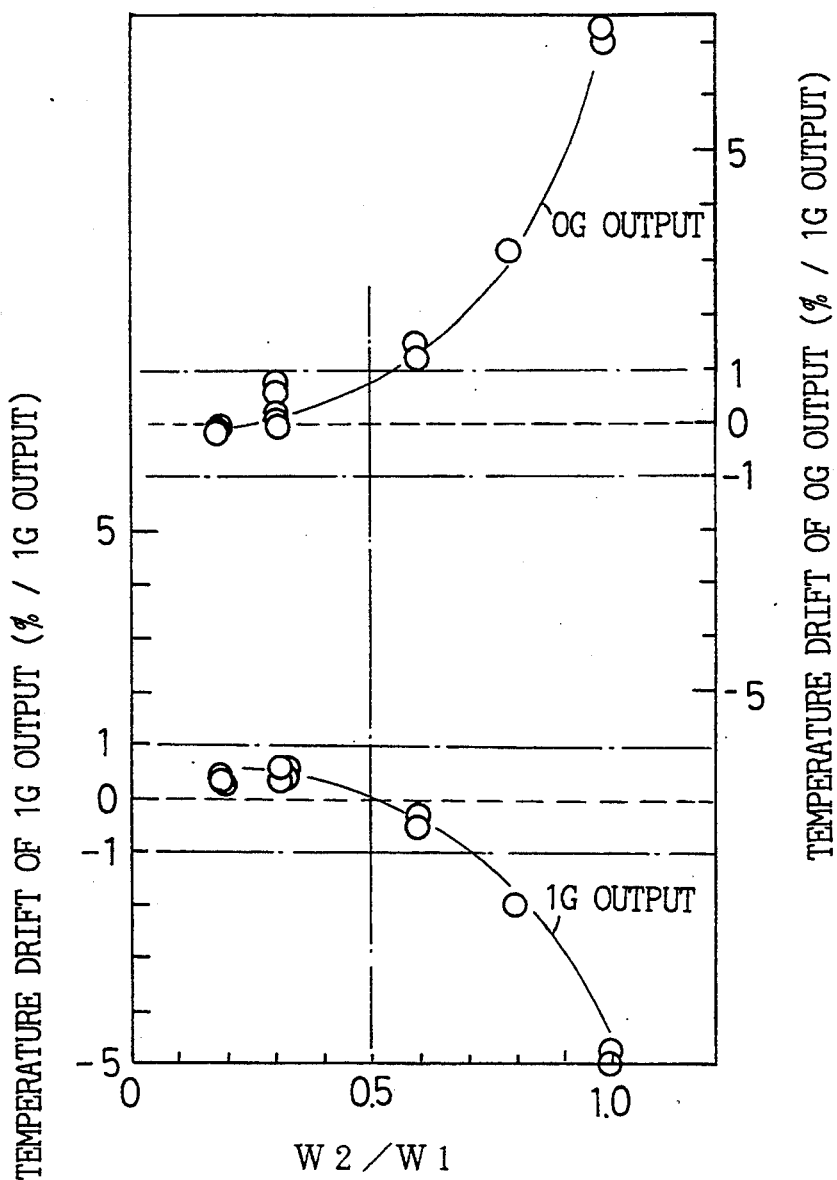
FIG. 19 is a characteristic curve showing a measurement result of a temperature drift of a sensor output relative to a ratio of a width of a central member and a width of a connecting member.
Figure 20:
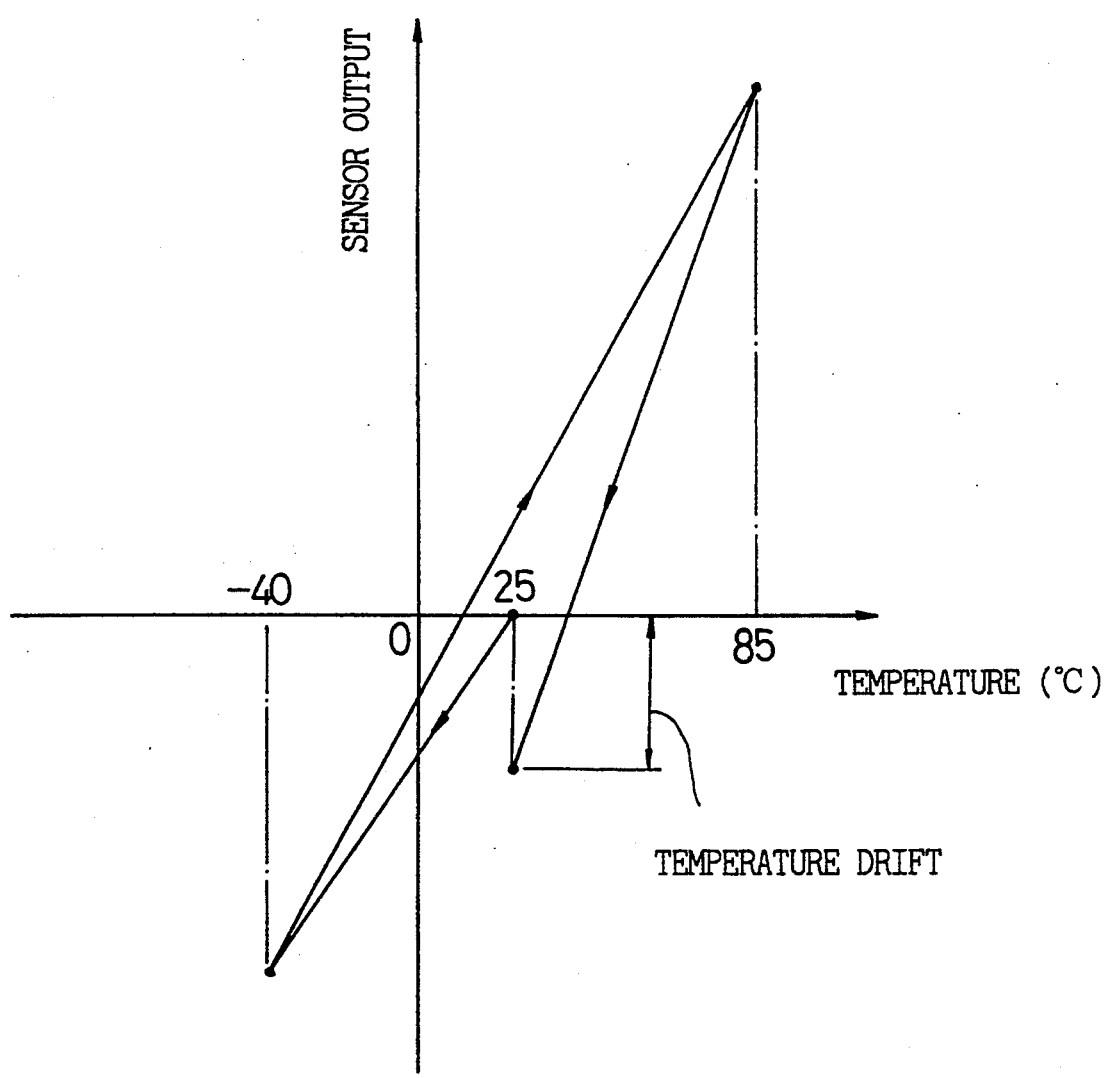
FIG. 20 is a graph showing a heat cycle for illustrating a temperature drift.

A cross section of the connecting member 13 that is a base portion of the central section 9 is made smaller, and a smaller area of the transmission path to the piezo-resistive layers is provided for a bonding strain generated between the peripheral section 8A and the base 7, thereby a stress to the flexible beams 14 to 17 becomes smaller. The measurement result of the ratio (W2/W1) relative to a temperature drift of 1G output and a temperature drift of 0G output is shown in FIG. 19 where as shown in FIG. 6, W1 represents a width of the central member 9A and W2 represents a width of the connecting member 13. The heat cycle at this time, as shown in FIG. 20, goes to +85° C. through −40° C. from +25° C. (ordinary temperature), and is allowed to return to 25° C., and the measurement is performed for a difference between a sensor output at +25° C. at the initial time of the cycle and a sensor output at +25° C. at the time after the cycle. Here, −40° C. to +85° C. are given to an atmospheric temperature, this comes from consideration of an atmospheric temperature where the automotive acceleration sensor is actually used. In FIG. 19, the temperature drifts of the 1G output and the 0G output can together be made equal to or less than ±1% by rendering (W2/W1) equal to or less than 0.5; thus a high quality of acceleration sensor can be realized.

In this way, a cross section of the connecting member 13 that is a base portion of the central section 9 is made smaller, in more detail, the ratio (W2/W1) of the width W1 of the central member 9A versus the width W2 of the connecting member 13 is made equal to or less than 0.5. In other words, a ratio of a cross section in a longitudinal direction of the central member 9A versus a cross section of the connecting member 13 is given of a value equal to or less than 0.5; therefore the cross section in the transmission path of the strain is narrowed and the strain hardly has an effect. From this reason, even when a strain due to variation of temperature and like factors arises on the connecting member where the peripheral section 8A of the silicon chip 6 is connected with the base 7, such strain at the connecting member tends to attenuate with less effects on the flexible beams 14 to 17. Consequently, it is possible to accurately detect the strain caused in response to acceleration and like factors because of being less susceptible to effects of the bonding strain due to temperature variation and age.

The sensors are provided in the automotive room at the time of actual use, therefore, the silicon chips receive a heat cycle due to a sensor atmosphere. With the heat cycle being accompanied, a stress remains in the line of aluminum thin film electrically connected to the piezo-resistive layers. The temperature drift due to the remaining stress in the aluminum thin film line sometimes generates in the sensor output. In particular, as in the present embodiment, a significant problem arises in case of a wiring pattern of the long aluminum thin film lines on the surface of the silicon chip 6 by providing the central section 9.

To cope with this problem, in the semiconductor acceleration sensor according to the present embodiment, the aluminum lines 41 to 48 and 60 to 63 (for example, lines 44 in FIG. 8) are allowed to have a thickness of 1.3 $\mu$m, a width of 20 $\mu$m and a cross section of the line equal to or less than 40 $\mu$m$^2$. In this arrangement, the stress due to the heat cycle hardly remains in the aluminum lines, the sensor output by the piezo resistive layer is not affected thereby, and it is possible to accurately detect strain caused in response to the acceleration and the like. A result of the experimentation is described for evidence.

Figure 18:
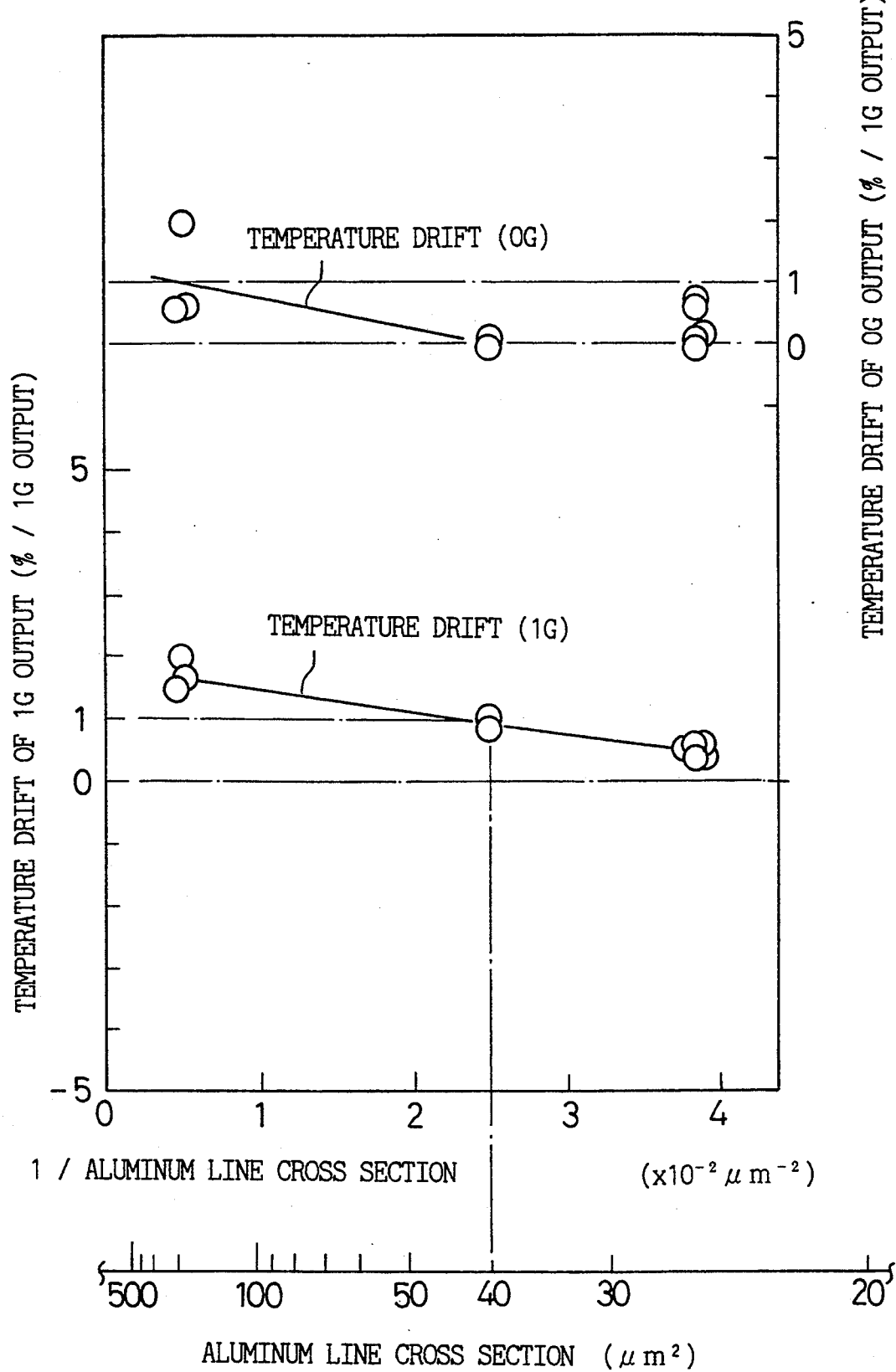
FIG. 18 is a measurement representation showing a relationship between a temperature drift of a sensor output and a cross section of aluminum wiring.

FIG. 18 shows a measurement result of cross section of the aluminum line relative to the temperature drift of the 1G output and the temperature drift of the 0G output. The heat cycle at this time, as shown in FIG. 20, goes from +25° C. (ambient temperature) through −40° C. to +85° C., and then is allowed to return to +25° C., and the measurement is performed for a difference between a sensor output at +25° C. at the initial time of the cycle and a sensor output at +25° C. at the time after the cycle. Here, the temperature drift (thermal hysteresis) is generated in that by applying a stress to the aluminum wiring member by both the temperature difference caused during heat cycle and the thermal expansion difference between the silicon and the aluminum line member, thus the inside stress value at the time of forming the lines in the aluminum wiring member is varied under the conditions before and after the heat cycle, and the result thus obtained transmits to the piezo resistive layer.

In the experimentation, in more detail, an amount of temperature drift of the 1G output is made an average value of the temperature drift amount multiplied by +1G and the temperature drift amount multiplied by −1G.

As is apparent from FIG. 18, to reduce the temperature drift amount of the 1G output to less than 1%, the cross section of the aluminum line is required to be equal to or less than 40 $\mu$m$^2$. The aluminum line cross section equal to or less than 40 $\mu$m$^2$ provides a smaller variation of the inside stress value of the wiring member and a smaller stress at the time of transmitting to the piezo resistive layer. Such aluminum line cross section equal to or less than 40 $\mu$m$^2$ also provides a temperature drift amount less than 1% with respect to the 0G output.

The aluminum wiring which the inventors of the present invention have conventionally performed has a cross section of about 200 $\mu$m$^2$.

As mentioned above with reference to FIG. 15, the thickness of the silicon oxide film 32 formed on the flexible beams 14–17 is about 1000Å, and the thicknesses of the silicon oxide films 29 and 31 formed on the thicker portions of the wafer 28 are about 4500Å and 4000Å respectively. The thin film 32 on the flexible beam 14–17 presents a further advantage, namely to prevent the warping of the flexible beams. In this regard, when the films 29 or 31 are extended to cover the flexible beams 14–17, the flexible beams 14–17 warp during the cooling stage of the films 29 or 31.

Figure 5:
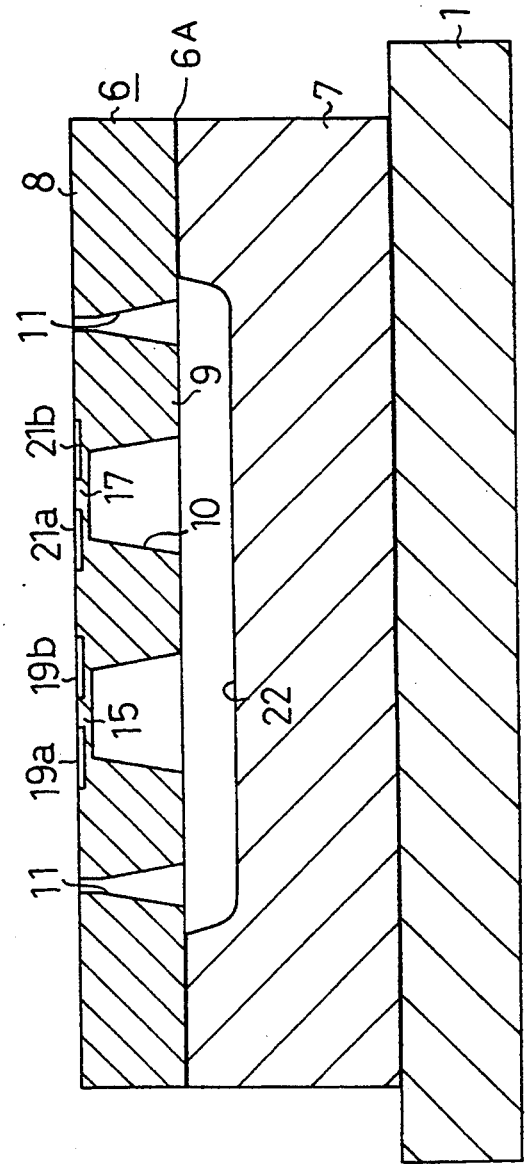
FIG. 5 is a greatly enlarged sectional elevational view of the senso/chip taken along line L5–L5 of FIG. 4.

The flexible beams 14–17 extend into support portions as shown in FIGS. 5 and 15. The support portions have a larger thickness than that of the flexible beams 14–17. They form the central section 9 and the mass 10. The P+ diffusion layer 33 extend from the flexible beams 14–17 to the support portions. The silicon oxide film 32 extends from the flexible beams 14–17 to the support portions. The layers 33 are substantially covered by the thin silicon oxide film 32, and not by the thicker silicon oxide film 29 or 31 in order to reduce the effect of the strain on the piezo-resistance of the layers 33. In fact, the strain generated between the wafer 28 and the silicon oxide film formed on the wafer 28 minimally affects the piezo-resistance of the layers 33 because the magnitude of the strain varies proportionally with respect to the thickness of the silicon oxide film.

Figure 21:
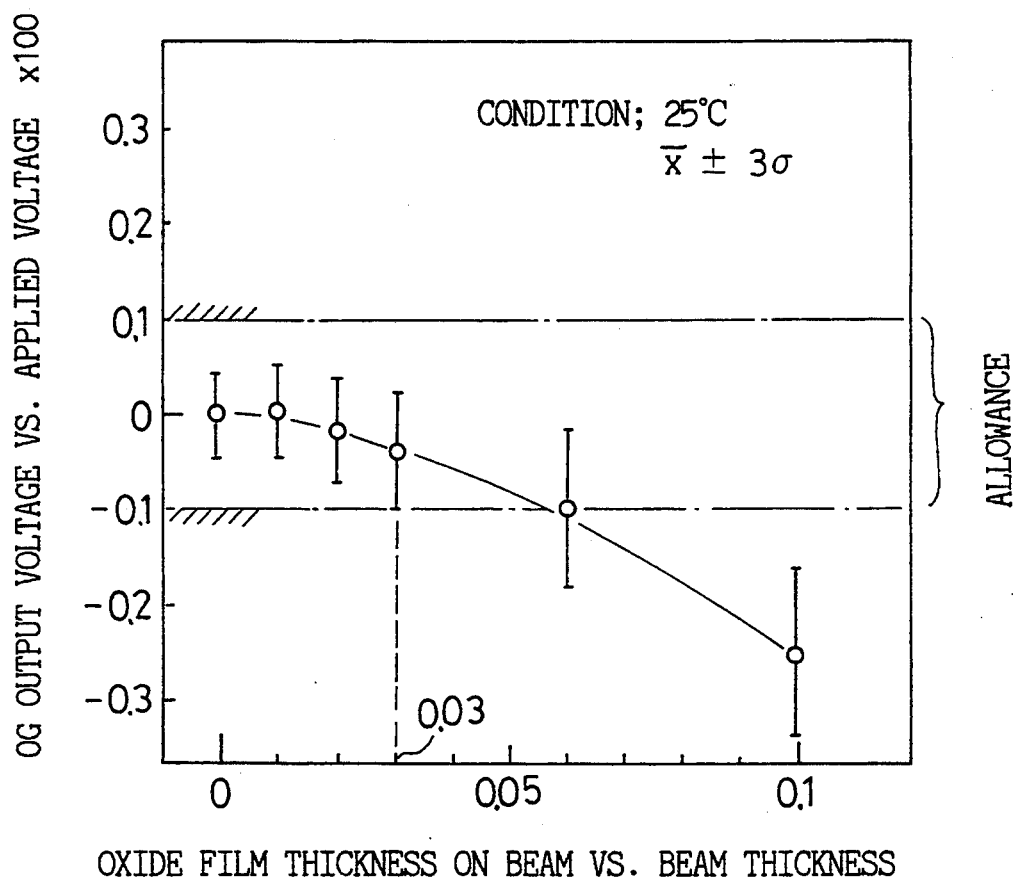
FIG. 21 is a measurement representation showing a shift of sensor output voltage relative to (thickness of protecting film/thickness of silicon)

A thickness of silicon in the flexible beams 14 to 17 and the protecting film thereon (silicon oxide film 32) are hereinafter described. A thickness of the protecting film (silicon oxide film 32) on the sensing section is made thinner, and a ratio of the thickness of the protecting film (silicon oxide film 32) versus a thickness of silicon of a sensing section is made smaller. Thereby, by reducing an influence (an expansion coefficient difference and an inside stress) from the protecting film (silicon oxide film 32) that is a foreign kind of member compared to silicon, then shift of the 0G output (zero G output) can be reduced. As shown in FIG. 21, the shift (shift including diffusion) of the 0G output can be made within ±0.1% by rendering (protecting film thickness/silicon thickness) equal to or less than 0.03. This means that the shift of a reference value at the time of the 0G (zero G) is avoided in the sensor of linear output type used for ABS.

In this embodiment, as illustrated in FIG. 15, the silicon oxide film 32 having 0.1 $\mu$m relative to the thickness 5 μm of the silicon is formed, and (protecting film thickness/silicon thickness) is given of 0.02 is used.

In an oxide film on the silicon in the flexible beams 14 to 17, as formerly described, before a contact hole is formed, phosphorus is thermally diffused at about 900° C. to 1000° C. and a surface of the oxide film is changed into a PSG state for the purpose of gettering contamination arisen from external sources. In this case, a thickness of the protecting film (silicon oxide film 32) is required to be equal to or more than 500Å so that the phosphorus is not diffused to the P+ diffusion layer 33 (gauge resistance layer) under the oxide film.

Figure 22:
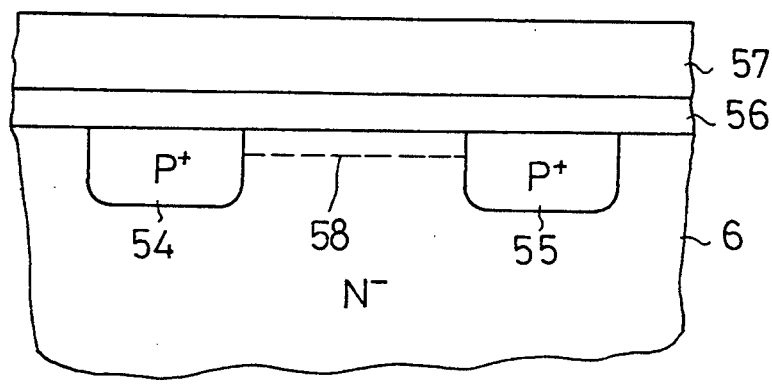
FIG. 22 is a greatly enlarged partial cross-sectional elevational view of the silicon chip of the sensor of FIGS. 1–6.

The following problem may be encountered when the thin silicon oxide film 32 are formed on the flexible beams 14–17 as well as on the entire surface of the support portions, and the thicker silicon oxide films 29 and 31 are not formed as described above. FIG. 22 shows impurity diffusion layers 54 and 55 diffused under a silicon oxide film 56 and an aluminum line 57. The layers 54 and 55 correspond to the layers 49–53 of FIG. 7, the film 56 corresponds to the films 29 and 31 of FIG. 15, and the line 57 corresponds to the lines 41–44 of FIG. 7 when the thickness of the silicon oxide film 56 is thin, a condenser structure composed of the line 57, the film 56 and electric charges 58 is formed, such that charges 58 are accumulated in the chip 6 between the layers 54 and 55 by an electric potential of the line 57. Therefore, the layers 54 and 55 would become undesirably short-circuited by the charges 58. In the present embodiment, the electrical charges do not accumulate because the total thickness (=8500Å) of the films 29 and 31 is significantly thick, thus avoiding the short-circuit effect between the layers 49–53.

In the preferred embodiment, aluminum lines 41 to 44 are used for connection, and the bonding pad, which is disposed along an edge where the connecting member 13 is not arranged, is utilized in the peripheral section 8A of the silicon chip 6. This reduces a supersonic vibration transmitted to the silicon chip 6 through the bonding pad at the time of wire bonding, and suppresses a vibration caused in the central section 9 through the connection member 13. Accordingly, even with an undesirable supersonic stress is anticipated at the time of mounting, deterioration and damage on the flexible beams 14 to 17 which are thin portions can be prevented.

When the silicon chip 6 and the electrical terminals 4 are wire bonded, a supersonic vibration of 20 to 60 kHz is applied to a capillary of a bonder and the wire 23 is pressed to fit. But, this supersonic vibration provides vibration onto the peripheral section 8A of the silicon chip 6, and vibration is generated in the central section 9 by such vibration transmission. Particularly in this embodiment, the flexible beams 14 to 17 provided with the piezo-resistive layer are formed to have a thickness as thin as about 5 μm, and it is found that the vibration of the central section 9 caused at the time of mounting this chip introduces the deterioration and damage of the flexible beams. In this embodiment, the bonding portion of the silicon chip 6, as described above, is formed to be disposed on the pad portion arranged along the edge, on which the connecting member 13 between the peripheral section 8A and the central section 9 is not arranged. The vibration applied to the silicon chip 6 at the time of mounting the chip, even if transmitted, is attenuated and the thin portion (flexible beams 14 to 17) provided with the piezo resistive layer is hardly affected therefrom.

As a result of investigating influence of the actual wire bonding to the thin portion, compared to using the bonding pad along the edge being arranged with the connecting member 13, the influence due to the wire bonding can be reduced to about 1/20 when using those along the other edges.

As hereinbefore described, according to the present embodiment, there can be reduced an adverse effect due to the supersonic stress added to the silicon chip 6 at the time of wire bonding, thus a highly reliable sensor can be provided.

Moreover, bonding strain is generated from the holes 5 when the sensor package 11A is attached to a vehicle. However, if the sensor chip 10A receives the bonding strain at all, the influence of the strain is very minimal.

Second embodiment

Figure 23:
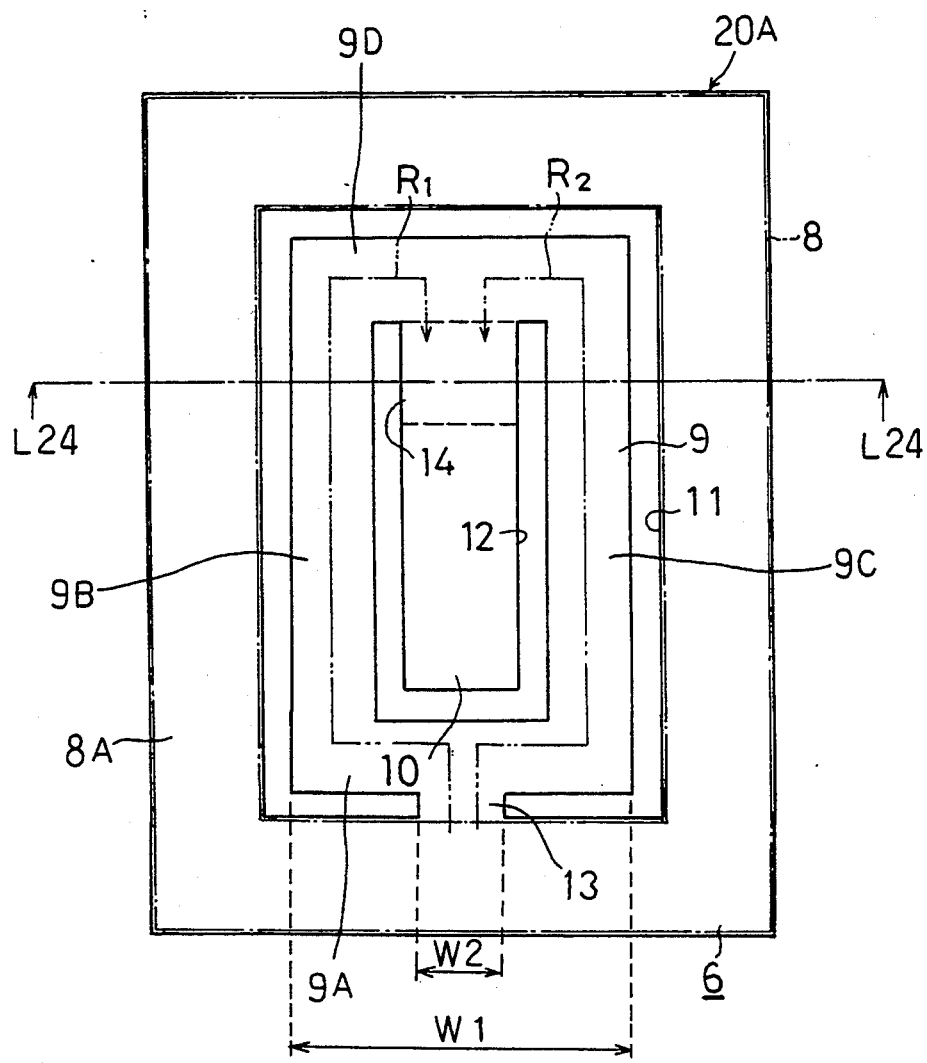
FIG. 23 is a top plan view of a chip which forms a part of a semiconductor acceleration sensor according to a second embodiment of the present invention.
Figure 24:
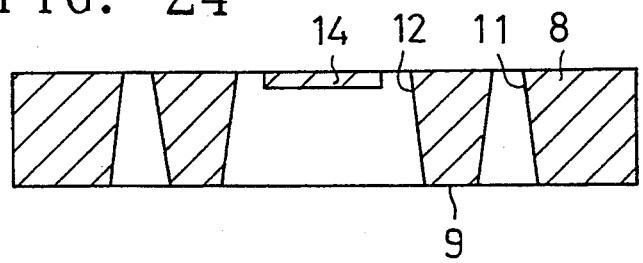
FIG. 24 is an elevational sectional view of the chip taken along line L24–L24 of FIG. 23.

FIGS. 23 and 24 show a semiconductor acceleration sensor chip 20A according to a second embodiment. The sensor chip 20A is generally similar to the sensor chip 10A with the exception of the design changes described hereafter. Like numerals in the corresponding figures indicate similar elements.

In the sensor chip 10A, the mass 10 is supported by the two lateral members 9B and 9C. However, the mass 10 may be supported by the central member 9D only as shown in FIG. 23. This type of sensor is generally referred to as a "cantilever type" sensor. The peripheral section 8A and the central section 9 are generally separated by a gap 11, but are connected by the connecting member 13. The thickness of the central section 9, the mass 10 and the connecting member 13 is generally similar to that of the peripheral section 8A which has thicker thickness. The central section 9 includes four members, the central member 9D, two generally identical and symmetrically disposed lateral members 9B and 9C, and another central member 9A connected to the peripheral section 8A via the connecting member 13. The flexible beam 14 having thinner thickness extends from the central member 9D and supports one side of the mass 10. Only one gap 12 is formed inside the central section 9.

Third embodiment

Figure 25:
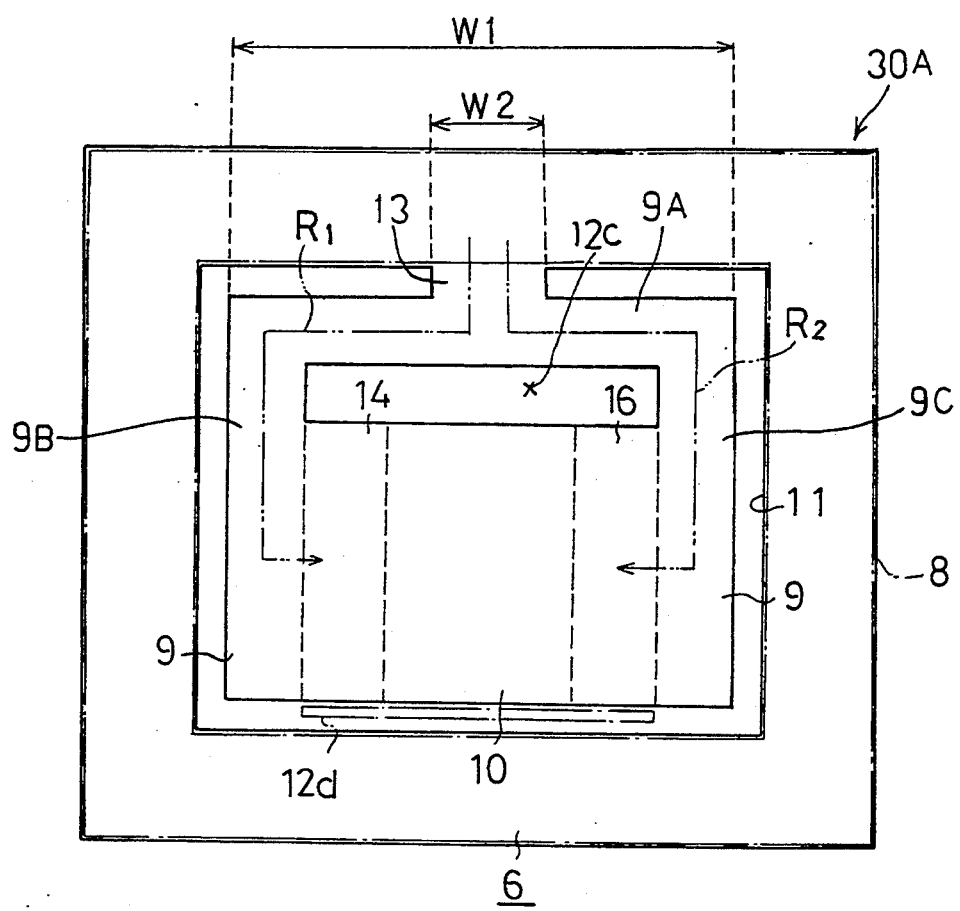
FIG. 25 is a top plan view of a silicon chip which forms a part of a semiconductor acceleration sensor according to a third embodiment of the present invention.

FIG. 25 shows another semiconductor acceleration sensor chip 30A according to a third embodiment which is similar to the first embodiment except not to form the grooves 12a and 12b.

The flexible beams 14 and 16 which have thin thickness extend from the lateral members 9B and 9C of the central section 9, respectively. The mass 10 is supported by the flexible beams 14 and 16. The connecting member 13 which has thick thickness connects the peripheral section 8A and the central member 9A of the central section 9.

Fourth embodiment

Figure 26:
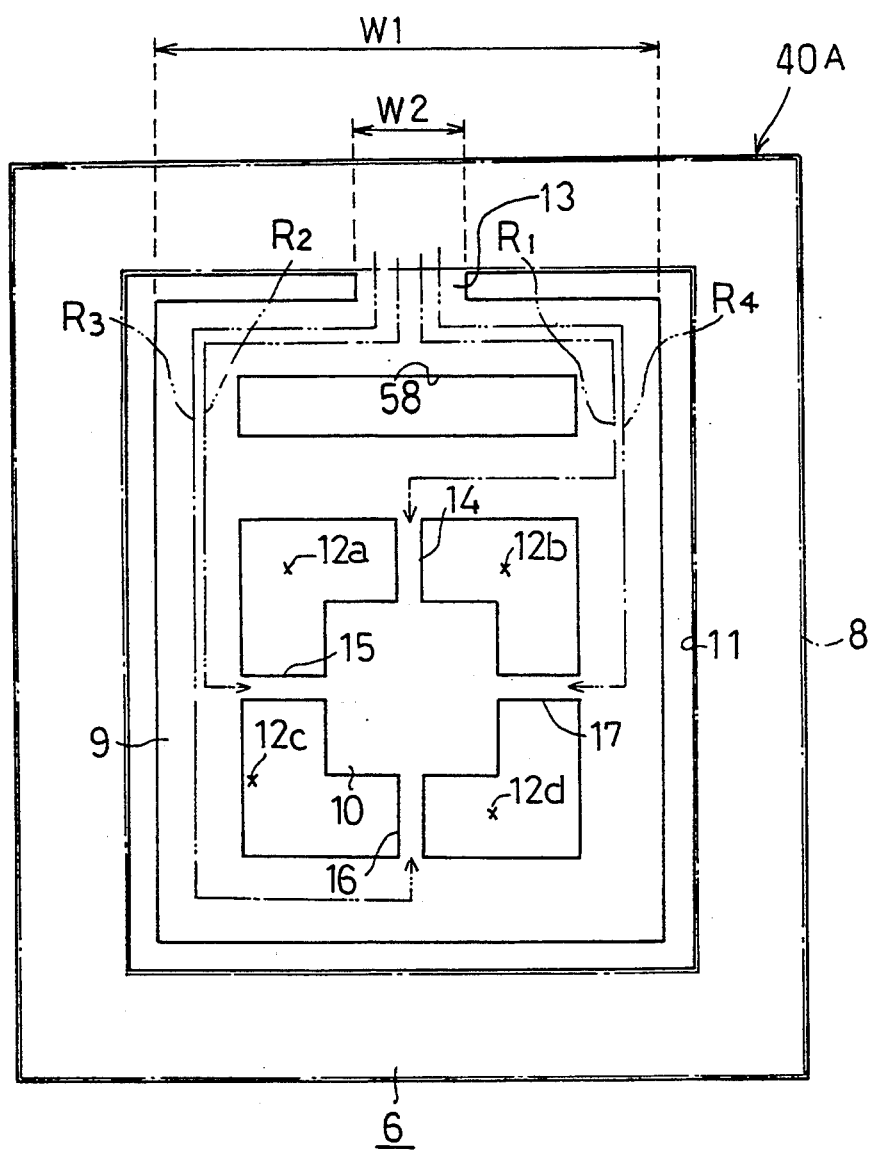
FIG. 26 is a top plan view of a silicon chip which forms a part of a semiconductor acceleration sensor according to a fourth embodiment of the present invention.

FIG. 26 shows still another semiconductor acceleration sensor chip 40A according to a fourth embodiment.

The central section 9 has a frame shape, and is connected with the peripheral section 8 by the connecting member 13. Each of the flexible beams 14–17 extends from the four members of the frame-shaped section 9 respectively. One of members close to the connecting member 13 has a gap 58 which detours the transmission path R1. The mass 10 is supported by the flexible beams 14–17 at its four sides.

Fifth embodiment and sixth embodiment

According to the structure of the section 9 shown in FIG. 4, the section 9 may be displaced in the direction Y shown in FIG. 4 because the section 9 expands or shrinks in accordance with change of an ambient temperature. In this case, the flexible beams 15 and 17 receive stress caused by the displacement of the section 9 more than the flexible beams 14 and 16. It follows that the balance of the resistance of the bridge circuit is lost. The fifth and sixth embodiments resolve the above-mentioned problem.

Figure 27:
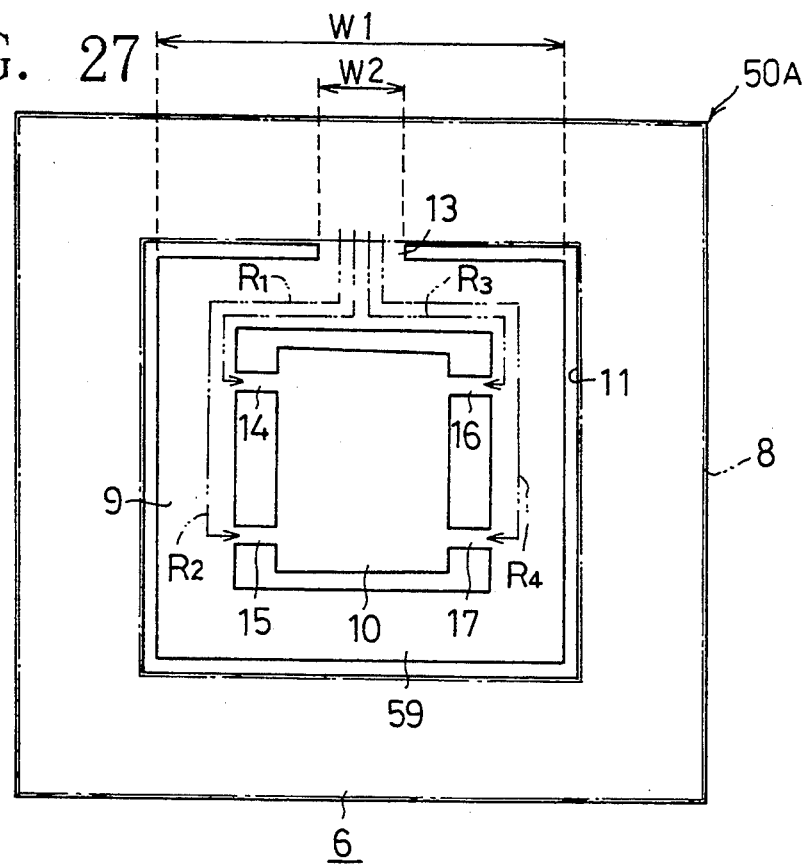
FIG. 27 a top plan view of a silicon chip which forms a part of a semiconductor acceleration sensor according to a fifth embodiment of the present invention.

FIG. 27 shows still another semiconductor acceleration sensor chip 50A according to the fifth embodiment.

The central section 9 has four members and has a square shape. One of the four members is connected with the peripheral section 8 through the connecting member 13. The flexible beams 14–17 extend from two members of the section 9. The mass 10 is supported by the flexible beams 14–17.

Figure 28:
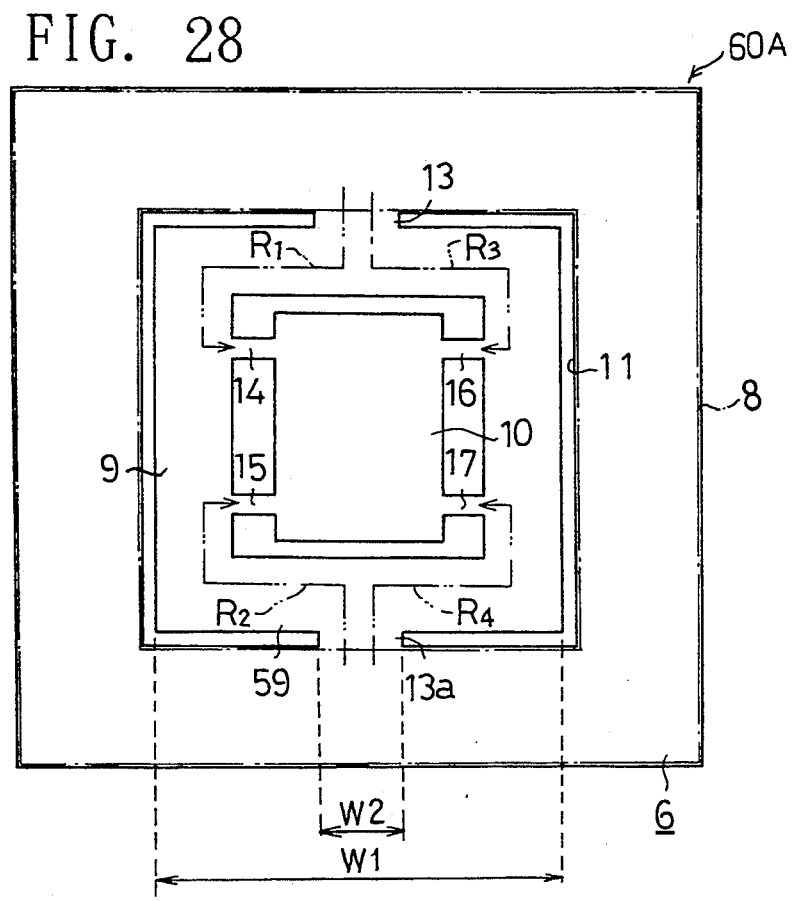
FIG. 28 is a top plan view of a silicon chip which forms a part of a semiconductor acceleration sensor according to a sixth embodiment of the present invention.

FIG. 28 shows still another semiconductor acceleration sensor chip 60A according to the sixth embodiment.

The central section 9 has four members and has a square shape. Two of the four members are connected with the peripheral section 8 through the connecting members 13. The flexible beams 14–17 extend from the other two members of the section 9. The mass 10 is supported by the flexible beams 14–17.

Because the section 9 of the fifth or sixth embodiment has the square shape, the above-mentioned stress equally affects each of the flexible beams 14–17. Therefore, the balance of the resistance of the bridge circuit is not lost. Moreover, according to the sixth embodiment, all transmission paths R1–R4 are equal in length. Therefore, the bonding stress also equally affects each of the flexible beams 14–17.

Seventh embodiment

Figure 29:
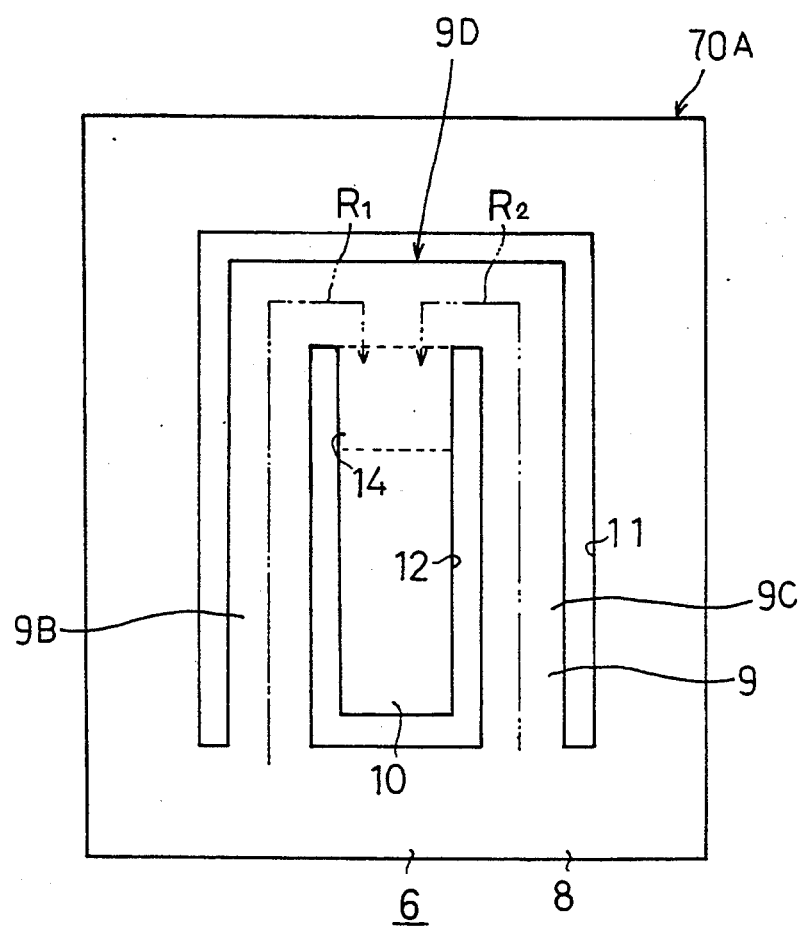
FIG. 29 is a top plan view of a silicon chip which forms a part of a semiconductor acceleration sensor according to a seventh embodiment of the present invention.

FIG. 29 shows a semiconductor acceleration sensor chip 70A according to a seventh embodiment. The sensor chip 70A is generally similar to the sensor chip 20A with the exception of the design changes described hereafter. Like numerals in the corresponding figures indicate similar elements.

In the sensor chip 70A, the central section 9 includes three members, the central member 9D and two generally identical and symmetrically disposed lateral members 9B and 9C. Both lateral members 9B and 9C are connected to the peripheral section 8A. The flexible beam 14 extends from the central member 9D and supports one side of the mass 10. Only one gap 12 is formed inside the central section 9.

Eighth embodiment

Figure 30:
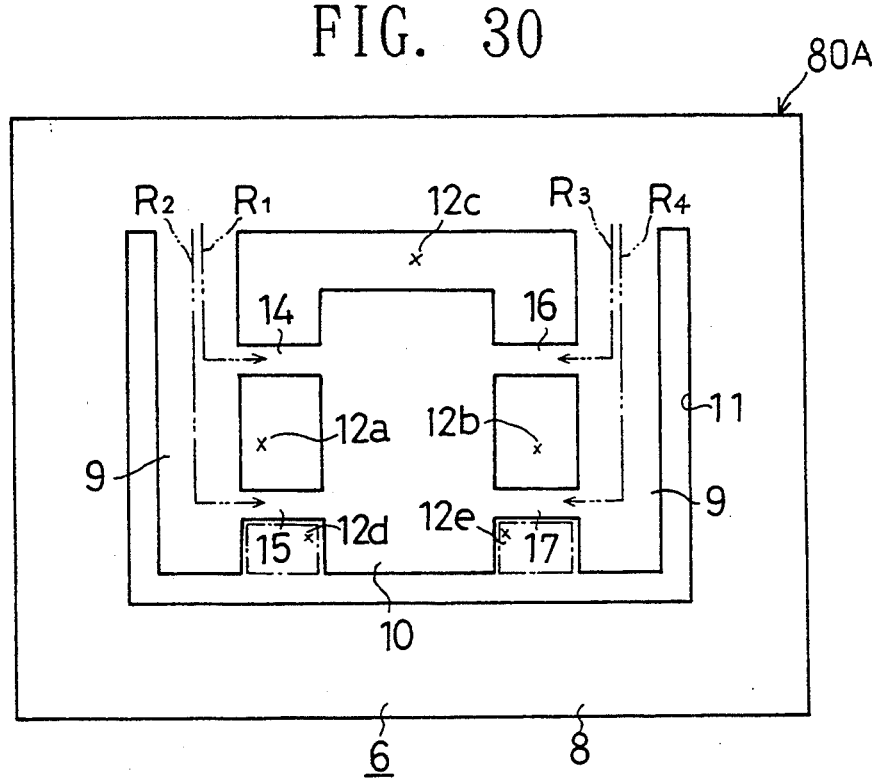
FIG. 30 is a top plan view of a silicon chip which forms a part of a semiconductor acceleration sensor according to an eighth embodiment of the present invention.

FIG. 30 shows a semiconductor acceleration sensor chip 80A according to a eighth embodiment, and includes two generally identical central sections 9 which are symmetrically disposed with respect to the mass 10.

The two central sections 9 are connected to the peripheral section 8. The flexible beams 14–17 extend from the central sections 9 to the mass 10, such that two flexible beams are connected to one side of the mass 10 for supporting it.

Ninth Embodiment

Figure 31:
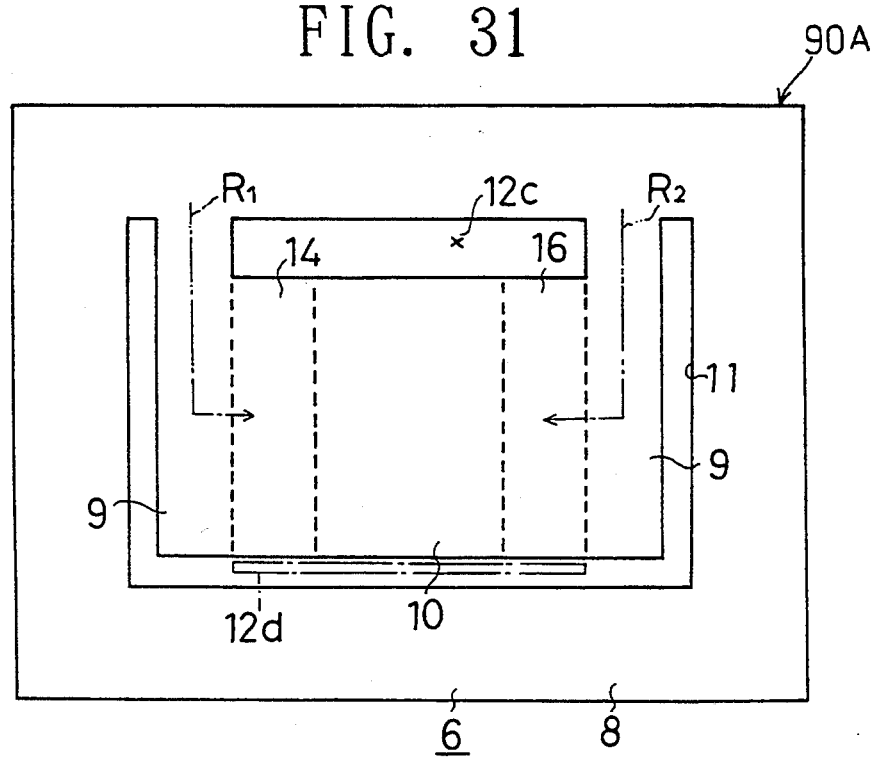
FIG. 31 is a top plan view of a silicon chip which forms a part of a semiconductor acceleration sensor according to a ninth embodiment of the present invention.

FIG. 31 shows a semiconductor acceleration sensor chip 90A according to a ninth embodiment which is similar to the eighth embodiment except not to form the grooves 12a and 12b.

The flexible beams 14 and 16 extend from the central section 9. The mass 10 is supported by the flexible beams 14 and 16.

Tenth embodiment

Figure 32:
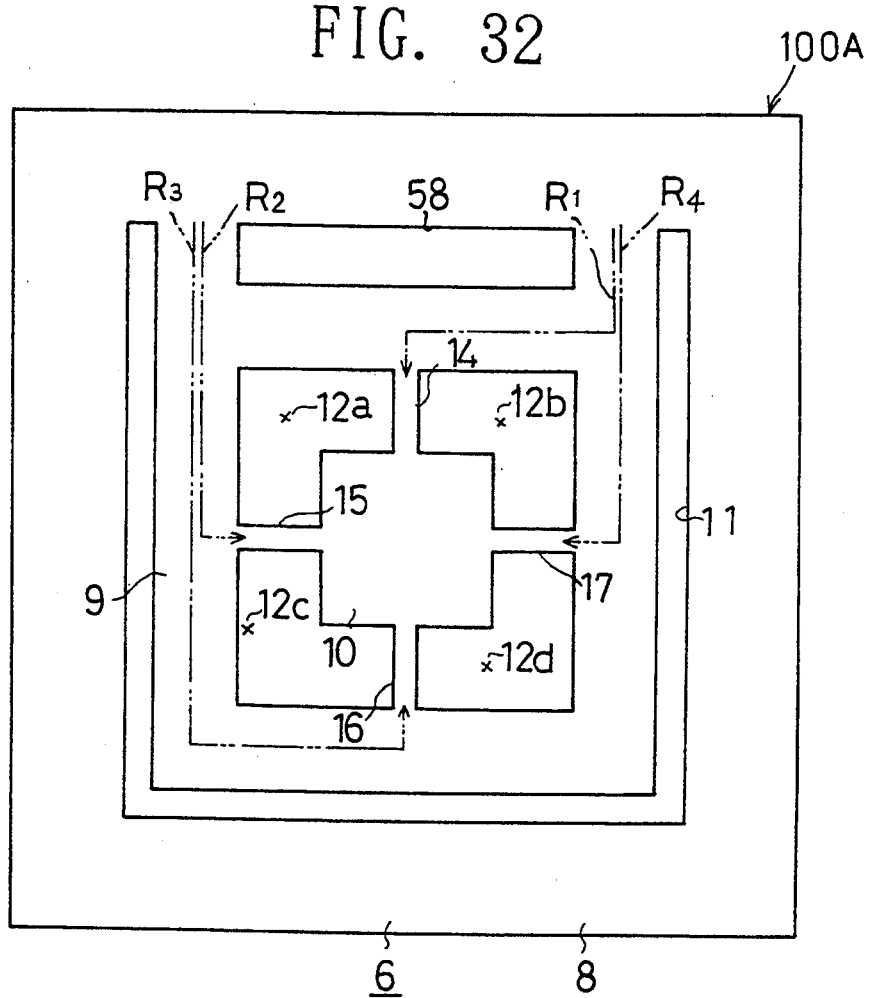
FIG. 32 is a top plan view of a silicon chip which forms a part of a semiconductor acceleration sensor according to a tenth embodiment of the present invention.

FIG. 32 shows a semiconductor acceleration sensor chip 100A according to a tenth embodiment.

The central section 9 has four members. Two of the four members are connected with the peripheral section 8. Another member extends from edges of the two members and connects them to each other. The other member extends from the middle of the two members and connects them to each other. Each of the flexible beams 14–17 extends from the members of the section 9 respectively. The mass 10 is supported by the flexible beams 14–17 at its four sides.

Eleventh embodiment

An eleventh embodiment of another sensor unit is described with reference to the drawings as described below.

Figure 33:
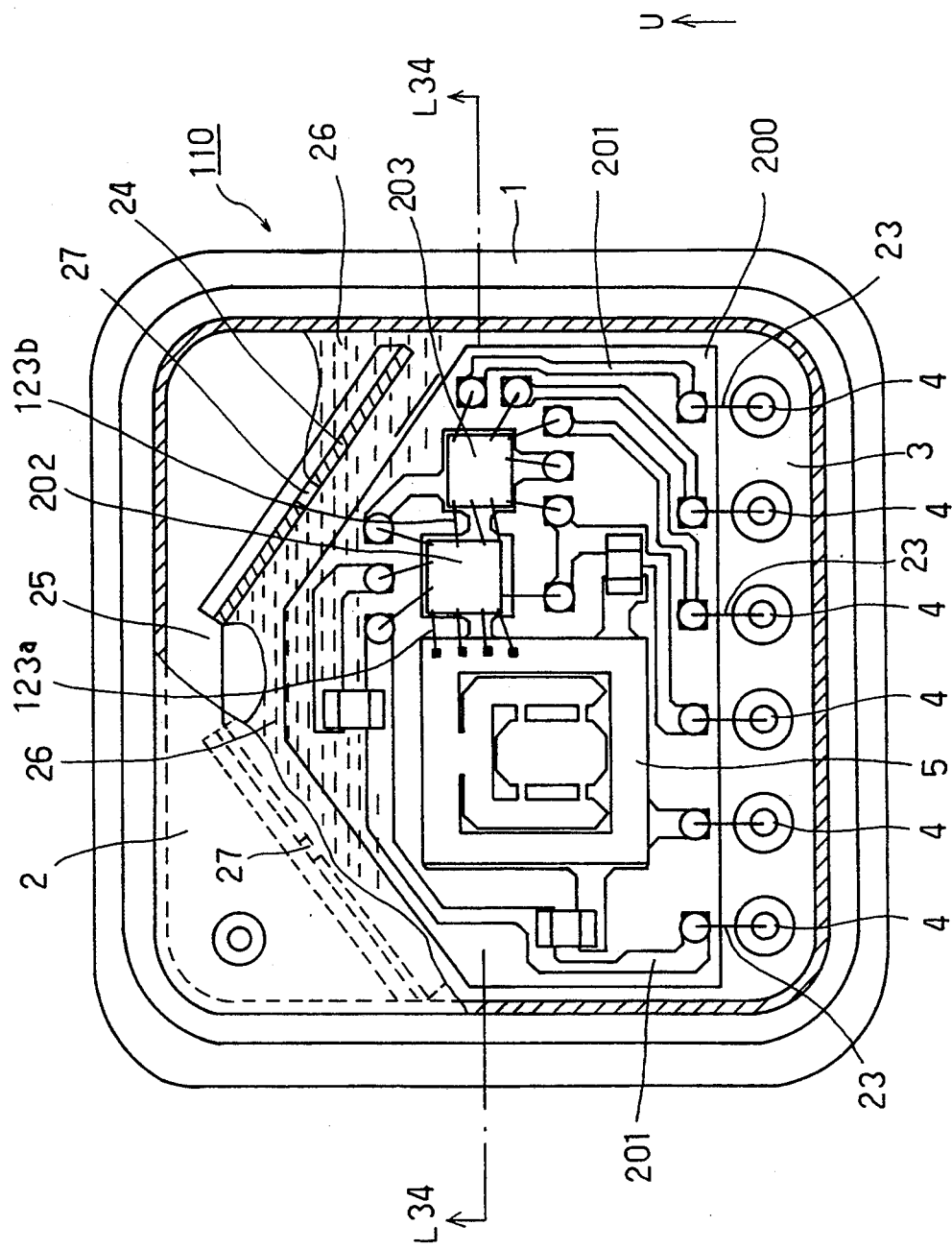
FIG. 33 is a partial cutaway view showing a sensor unit of an eleventh embodiment.
Figure 34:
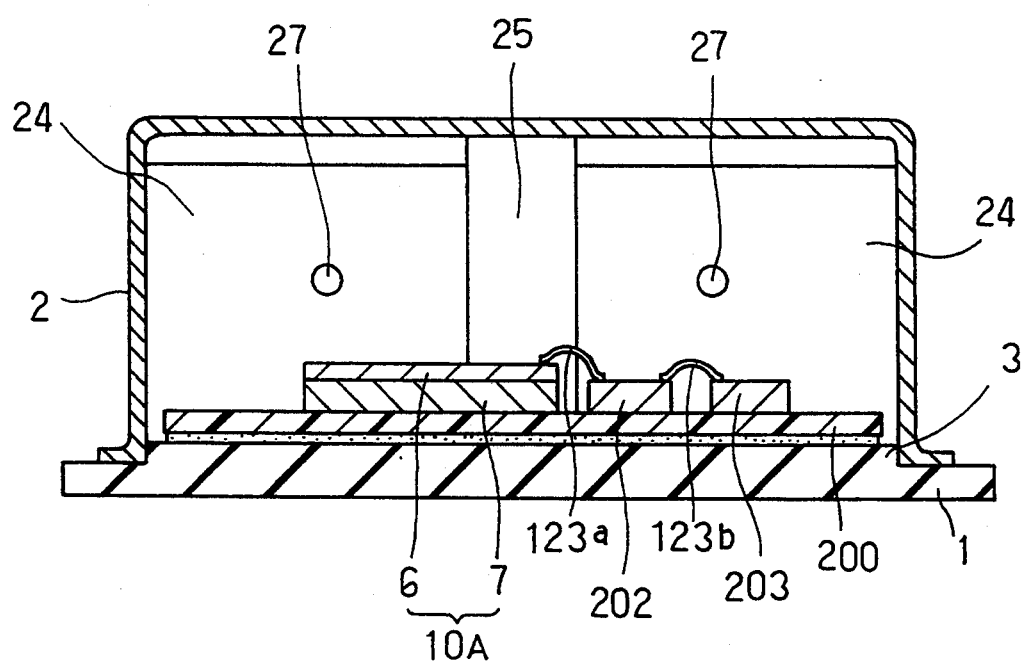
FIG. 34 is a enlarged sectional view taken along line L34–L34 of FIG. 33.
Figure 35:
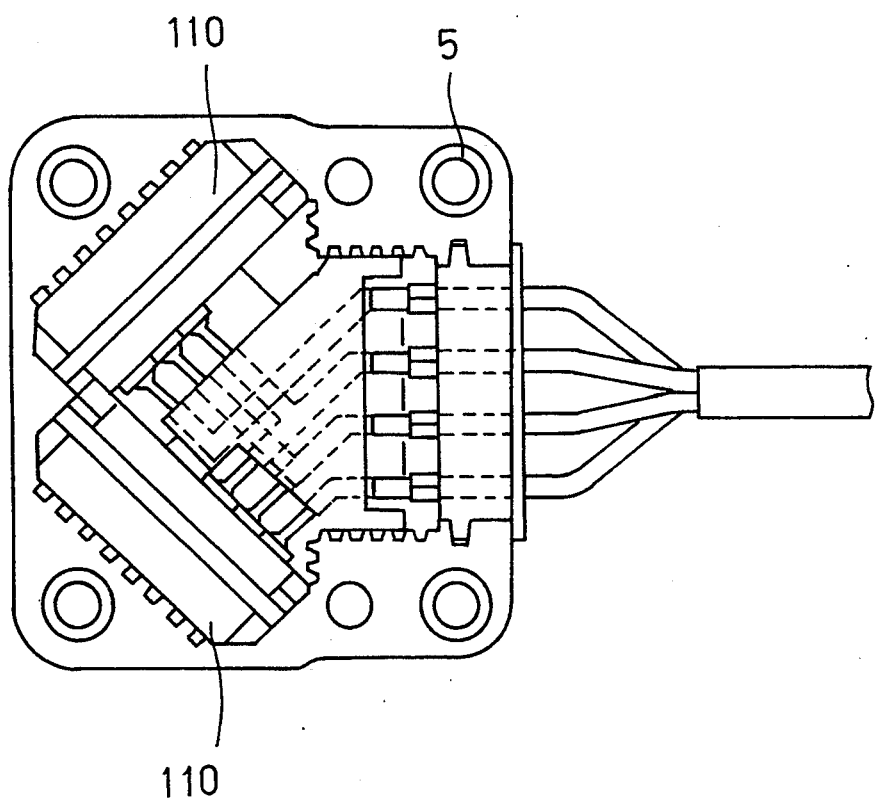
FIG. 35 is a view of one example of an entire construction of an/ABS accelerating sensor-assembly which is formed using the sensor unit shown in FIGS. 33 and 34.

FIG. 33 is a view of a sensor unit of a semiconductor acceleration sensor according to the eleventh embodiment, and FIG. 34 is a sectional view taken along line L34–L34 of FIG. 33. The sensor unit is used for a vehicle ABS sensor, and FIG. 35 shows an example of an entire ABS acceleration sensor-assembly comprised of such a sensor unit 110. The same numerals are given for the equivalent parts of the structure as those of the first embodiment described. The sensor chip 10A shown in FIGS. 3 to 7 is used as a sensor chip in this embodiment.

A package member for accommodating the sensor chip 10A is formed of a stem 1 and a shell (cover member) 2 coupled on an upper surface thereof. The stem 1 is composed of metallic material such as Kovar and the like and the shell 2 is composed of metallic material such as iron and the like. The stem 1 is formed on its center portion with a raised portion 3 on which 6 pieces of lead terminals 4 are fixed in a manner of penetrating by glass fusion process.

A top surface of the raised portion 3 of the stem 1 is attached with a ceramic circuit substrate 200, which is loaded of a silicon chip 6 (sensor chip 10A) having a base 7, an IC chip 202 for amplifying a piezo-resistive strain output, an IC chip 203 used for characteristic adjustment, and a thick film element such as a thick film resistor and the like. These circuit elements are connected with each other on the circuit substrate 200 by substrate wire 201 and bonding wires 123a and 123b. The bonding pad of the silicon chip 6 is connected with the IC chip 202 similarly loaded on the ceramic circuit substrate 200 by the wire 123a. The IC chip 202 and the IC chip 203 are also connected by the wire 123b. A power source of IC chips 202 and 203, the earth, and the output terminals are connected, through the substrate wire 201 formed on the ceramic circuit substrate 200, with 6 pieces of lead terminals 4 provided each on the stem 1 by the wire 23.

As shown in FIGS. 33 and 34, two sheets of partition walls 24 are provided above the ceramic circuit substrate 200 within the shell 2 and positioned in a manner that the more upper the portions thereof the more approximate with each other. Opposing end portions of the two partition walls 24 form a communication opening 25 for damping liquid. The damping liquid 26 such as silicone oil or the like is filled in the lower-side of the partition walls 24. Communication holes 27 for communicating gas are formed on the partition walls 24 respectively.

When the sensor unit of this embodiment is attached to the vehicle that is an object to be detected, then as shown in FIG. 35 the two sensor units 110 are used and formed into a biaxial unitary body using a resin package, and fixed on the car-body through a contact hole 5 so that a direction shown by arrow marked U in FIG. 33 is coincident to an upward direction (opposite to the pull of gravity) of the vehicle.

In this embodiment, the sensor unit is incorporated therein with not only a sensor chip but also a signal processing circuit. A chip loaded on the ceramic circuit substrate 200, as shown in FIG. 33, is composed of three-chip constitution; namely, the sensor chip 10A formed of the base 7 and the silicon chip 6, the IC chip 202 for amplifying the piezo-resistive strain output, and the IC chip 203 for the characteristic adjustment. The IC chip 202 is, composed of for example bipolar IC as a high quality, high gain amplifier, and the IC chip 203 is composed of a MOSβIC including an EPROM and the like stored with a correction value used for the characteristic adjustment. These chips can, of course, be supplied in a unitary form, i.e., one chip. However, when they are formed at every process basis, namely, the sensor chip 10A by micro-machining, the IC chip 202 by the bipolar process, and the IC chip 203 by the MOS process, each chip can be made smaller to effectively improve the yield rate as compared to unitarily forming one chip.

The present invention has been described with reference to the above-mentioned embodiments, but the present invention is not limited to these embodiments and can be modified without departing from the spirit or concept of the present invention. For example, the sensor may detect strain other than the acceleration.

What is claimed is:
1. A semiconductor strain sensor, comprising:
    a base;
    a peripheral section bonded to said base, bonding strain being generated at a bonding portion between said base and said peripheral section;
    a central section extending from said peripheral section via a connecting member, said central section and said connecting member each having a thickness approximately equal to that of the peripheral section;
    a flexible beam extending from said central section and including a strain detecting element which changes its electric characteristic when strain is applied thereto, a thickness of said flexible beam being thinner than a thickness of said central section, and
    wherein a transmission path through which bonding strain generated at said bonding portion is transmitted from said bonding portion to said strain detecting element is bent.
2. A semiconductor strain sensor according to claim 1, wherein said strain detecting element is a piezo-resistive layer.
3. A semiconductor strain sensor according to claim 1, wherein said peripheral section, said central section and said flexible beam are made of a single semiconductor substrate.
4. A semiconductor strain sensor according to claim 3, wherein said semiconductor substrate is a silicon substrate.
5. A semiconductor strain sensor according to claim 3, wherein a thermal expansion coefficient of said semiconductor substrate is different from a thermal expansion coefficient of said base.
6. A semiconductor strain sensor according to claim 5, wherein said base is made of glass.
7. A semiconductor strain sensor according to claim 4, wherein the thickness of said flexible beam is less than 15 μm.
8. A semiconductor strain sensor according to claim 1, wherein said peripheral section has a rectangular shape.
9. A semiconductor strain sensor according to claim 1, wherein a longitudinal direction of said central section is different from a longitudinal direction of said flexible beam.
10. A semiconductor strain sensor according to claim 1, wherein said central section is composed of at least two members, at least one of said two members being connected with said peripheral section.
11. A semiconductor strain sensor according to claim 10, wherein said central section is composed of two members, and said two members are connected with said peripheral section.
12. A semiconductor strain sensor according to claim 11, further comprising:
    a mass;
    a plurality of said flexible beams supporting said mass, and wherein at least one of said flexible beams intervenes between one of said two members and said mass, and the other of said flexible beams intervenes between the other of said two members and said mass.
13. A semiconductor strain sensor according to claim 10, wherein said central section is composed of three members, two of said three members extend from edges of the other of said three members, and a longitudinal direction of said two members is different from a longitudinal direction of said the other member.
14. A semiconductor strain sensor according to claim 13, further comprising:
    a mass;
    a plurality of said flexible beams supporting said mass, and wherein said the other member is connected with said peripheral section through a connecting member, at least one of said flexible beams intervenes between one of said two members and said mass, and the other of said flexible beams intervenes between the other of said two members and said mass.
15. A semiconductor strain sensor according to claim 13, further comprising a mass which is supported by said flexible beams, wherein said two members are connected with said peripheral section, and said flexible beam intervenes between said the other member and said mass.
16. A semiconductor strain sensor according to claim 10, wherein said central section is composed of four members, and said four members form a rectangular shape.
17. A semiconductor strain sensor according to claim 16, further comprising:
    a mass;
    a plurality of said flexible beams supporting said mass, and wherein one of said four members is connected with said peripheral section through a connecting member.

18. A semiconductor strain sensor according to claim 16, wherein said two of said four members are connected with said peripheral section.

19. A semiconductor strain sensor according to claim 18, further comprising:
a mass;
a plurality of said flexible beams supporting said mass, and wherein said one of said two members is opposite to the other of said two members, and said flexible beam intervenes between the other two of said four members and said mass.

20. A semiconductor strain sensor, comprising:
a base;
a peripheral section bonded to said base, bonding strain being generated at a bonding portion between said base and said peripheral section;
a central section extending from said peripheral section via a connecting member, each of said central section and said connecting member having a first thickness; and
a flexible beam having a second thickness extending from said central section and including a strain detecting element which changes its electrical characteristics when strain is applied thereto, said second thickness being less than said first thickness, and a longitudinal direction of said flexible beam being different from a longitudinal direction of said central section.

21. A semiconductor strain sensor, comprising:
a base;
a peripheral section bonded to said base, bonding strain being generated at a bonding portion between said base and said peripheral section;
a central section extending from said peripheral section via a connecting member, each of said central section and said connecting member having a first thickness, said central section being composed of at least two members, and a longitudinal direction of one of said two members being different from a longitudinal direction of the other of said two members; and
a flexible beam having a second thickness, extending from said central section and including a strain detecting element which changes its electric characteristic when strain is applied thereto, said second thickness being less than said first thickness.

22. A semiconductor strain sensor, comprising:
a base;
a chip bonded on said base and including a peripheral section, and a central section;
said peripheral and central sections being separated by a gap and interconnected by a connecting member having a thickness approximately equal to that of at least one of said peripheral and central sections;
said central section including means for detecting strain applied to the sensor; and
a transmission path for minimizing the effect of bonding strain on said detecting means, said transmission path being bent at predetermined locations for causing said bonding strain to become attenuated prior to reaching said detecting means.

23. A semiconductor strain sensor, comprising:
a base;
a means for detecting strain formed of a semiconductor element;
a flexible beam of a first thickness having said detecting means; and
a supporting member of a second thickness greater than said first thickness connected to said base and supporting said flexible beam,
wherein said supporting member is including a peripheral section connected to said base, a central section supporting said flexible beam and connected to said peripheral section via a connecting member, and a groove penetrating through said supporting member, said groove provided on a line connecting between both said sections at a shortest distance, and both said sections are connected to each other in a manner of making a detour.

24. A semiconductor strain sensor according to claim 1, wherein a ratio of a cross section of a portion extending from a peripheral section of said central section to a cross section of said central section is equal to or less than 0.5.

25. A semiconductor strain sensor according to claim 14, wherein a ratio of a cross section of said connecting member to a cross section in a longitudinal direction of said other member is equal to or less than 0.5.

26. A semiconductor strain sensor according to claim 14, wherein a ratio of a width of said connecting member to a width in a longitudinal direction of said other member is equal to or less than 0.5.

27. A semiconductor strain sensor according to claim 1, further comprising a metal wiring extending to said strain detecting element from said peripheral section, said metal wiring having a cross section equal to or less than 40 $\mu m^2$.

28. A semiconductor strain sensor according to claim 27, wherein a bonding section of said metal wiring is provided on said peripheral section, said bonding section being apart from a section where said central section extends from said peripheral section.

* * * * *